United States Patent
Chou

(10) Patent No.: US 8,679,878 B2
(45) Date of Patent: Mar. 25, 2014

(54) ARRAY SUBSTRATES AND METHODS FOR MANUFACTURING THE SAME

(75) Inventor: Cheng-Hsu Chou, Miao-Li County (TW)

(73) Assignee: Chimei Innolux Corporation (TW)

( * ) Notice: Subject to any disclaimer, the term of this patent is extended or adjusted under 35 U.S.C. 154(b) by 0 days.

(21) Appl. No.: 13/325,585

(22) Filed: Dec. 14, 2011

(65) Prior Publication Data

US 2012/0153312 A1  Jun. 21, 2012

(30) Foreign Application Priority Data

Dec. 16, 2010 (TW) .............................. 99144150 A

(51) Int. Cl.
*H01L 21/00* (2006.01)

(52) U.S. Cl.
USPC 438/34; 438/158; 257/E29.291; 257/E29.294

(58) Field of Classification Search
None
See application file for complete search history.

(56) References Cited

U.S. PATENT DOCUMENTS

| | | | |
|---|---|---|---|
| 8,138,500 B2* | 3/2012 | Hosoya | 257/59 |
| 8,148,730 B2* | 4/2012 | Hosoya et al. | 257/72 |
| 8,273,590 B2* | 9/2012 | Chou | 438/34 |
| 2004/0126917 A1 | 7/2004 | Yoo et al. | |
| 2005/0077523 A1 | 4/2005 | Ahn et al. | |

FOREIGN PATENT DOCUMENTS

| TW | I262470 | 9/2006 |
|---|---|---|
| TW | 200810125 | 2/2008 |
| TW | I319911 | 1/2010 |

OTHER PUBLICATIONS

Office Action dated Aug. 28, 2013 from corresponding application No. TW 099144150.
Office Action dated Aug. 19, 2013 from corresponding application No. CN 201010616900.0.

* cited by examiner

*Primary Examiner* — Thien F Tran
(74) *Attorney, Agent, or Firm* — Lowe Hauptman & Ham, LLP

(57) ABSTRACT

Disclosed is a method of forming array substrates having a peripheral wiring area and a display area. The method is processed by only three lithography processes with two multi-tone photomasks and one general photomask. In the peripheral wiring area, the top conductive line directly contacts the bottom conductive line without any other conductive layer. The conventional lift-off process is eliminated, thereby preventing a material (not dissolved by a stripper) from suspending in the stripper or remaining on the array substrate surface.

7 Claims, 33 Drawing Sheets

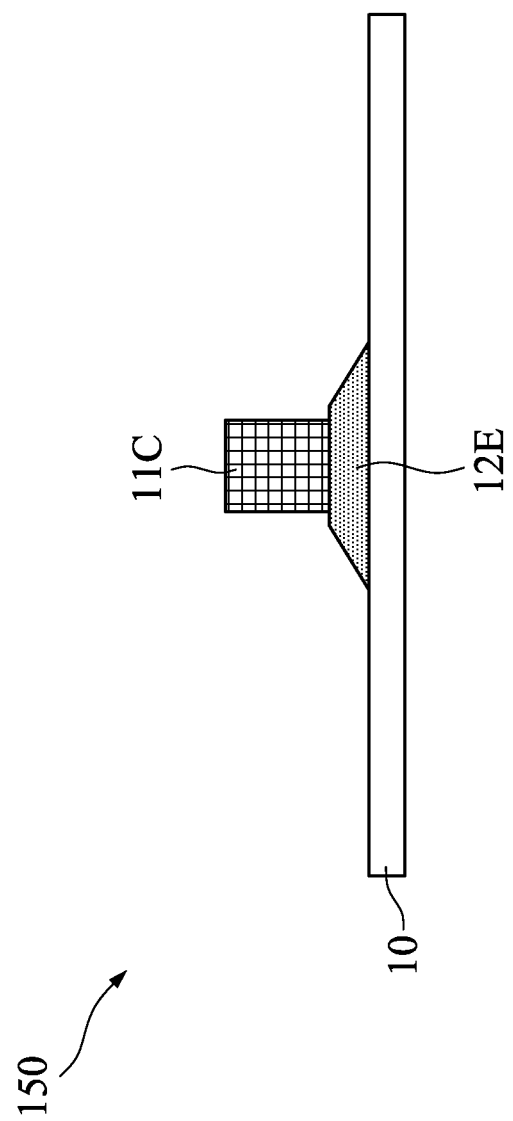

ARRAY SUBSTRATES AND METHODS FOR MANUFACTURING THE SAME

CROSS REFERENCE TO RELATED APPLICATIONS

This Application claims priority of Taiwan Patent Application No. 099144150, filed on Dec. 16, 2010, the entirety of which is incorporated by reference herein.

BACKGROUND OF THE INVENTION

1. Field of the Invention

The present invention relates to a process of manufacturing a liquid crystal display, and in particular relates to a method of manufacturing an array substrate thereof.

2. Description of the Related Art

General processes of forming an array substrate in a liquid crystal display need four or five lithography steps; thus, four or five photomasks are used. A lithography step with only three photomasks utilizes a lift-off process, which firstly forms a photoresist layer as a sacrificing layer of a coating film. Thereafter, the coating film is deposited on regions covered and not covered by the photoresist layer, and then the substrate is dipped in a stripper. The coating film on the photoresist layer can be stripped with the removal photoresist layer, thereby saving use of a photomask. However, using the substrate containing the photoresist layers in general mass production equipment of thin film transistors for depositing the coating is not allowed. The stripped coating film easily adheres to the substrate to form defects, or suspends in the stripper to obstruct stripper pipes.

Accordingly, a novel method which may replace the conventional lift-off process without increasing photomasks is called for.

BRIEF SUMMARY OF THE INVENTION

One embodiment of the disclosure provides a method of forming an array substrate, comprising: forming a first conductive layer on a substrate; forming a first photoresist layer on the first conductive layer; patterning the first photoresist layer by a lithography process with a first multi-tone photomask to form a first non-photoresist region, a first thin photoresist pattern, and a first thick photoresist pattern; etching the first conductive layer of the first non-photoresist region to form a gate electrode, a gate line connecting to the gate electrode, a common line, and a bottom conductive line, wherein the first thin photoresist pattern is on the gate electrode, the gate line, the common line, and a wiring region of the bottom conductive line, and wherein the first thick photoresist pattern is on a contact region of the bottom conductive line; ashing the first thin photoresist pattern to expose the gate electrode, the gate line, the common line, and the wiring region of the bottom electrode; selectively depositing an insulation layer on the substrate, the gate electrode, the gate line, the common line, and the wiring region of the bottom conductive line; selectively depositing a semiconductor layer on the insulation layer; removing the first thick photoresist pattern; and forming a second conductive layer on the semiconductor layer and the contact region of the bottom conductive line.

One embodiment of the disclosure provides a method of forming an array substrate, comprising: forming a gate electrode, a gate line connecting to the gate electrode, and a common line on a substrate; depositing an insulation layer on the substrate, the gate electrode, the gate line, and the common line; depositing a semiconductor layer on the insulation layer; depositing a conductive layer on the semiconductor layer; forming a photoresist layer on the conductive layer; patterning the photoresist layer by a lithography process with a multi-tone photomask to form a non-photoresist region, a thin photoresist pattern, a sub-thick photoresist pattern, and a thick photoresist pattern; removing the conductive layer and the semiconductor layer of the non-photoresist region to form a data line, a conductive pattern connecting to the data line, a channel layer, and a top electrode, wherein the data line and the gate line vertically cross with each other for defining a pixel region, wherein the channel layer is disposed between the gate electrode and the conductive pattern, wherein the top electrode covers a part of the common line for defining a storage capacitor, and wherein the thin photoresist pattern corresponds to a center part of the gate electrode, and the sub-thick photoresist pattern corresponds to two sides of the conductive pattern, the data line, and the top electrode; ashing the thin photoresist pattern to expose the conductive pattern on the center part of the gate electrode; removing the exposed part of the conductive pattern to expose the channel layer on the center part of the gate electrode for forming a source electrode and a drain electrode, wherein the thick photoresist pattern corresponds to a part of the drain electrode and a part of the top electrode; ashing the sub-thick photoresist pattern to expose the source electrode, the drain electrode, the data line, and the top electrode; selectively depositing a passivation layer on all regions other than the thick photoresist pattern; ashing the thick photoresist pattern to expose the part of the drain electrode and the part of the top electrode; and forming a pixel electrode pattern on the passivation layer of the pixel electrode, wherein the pixel electrode pattern connects to the exposed part of the drain electrode and the exposed part of the top electrode.

One embodiment of the disclosure provides an array substrate, comprising: a bottom conductive line on a substrate; an insulation layer on the bottom conductive line and the substrate, wherein the insulation layer includes an opening to expose a part of the bottom electrode; a top conductive line on the insulation layer, wherein the top conductive line connects to the bottom conductive line through the opening; and a passivation layer on the top conductive line and the substrate, wherein the top conductive line and the insulation layer have a semiconductor layer interposed therebetween.

A detailed description is given in the following embodiments with reference to the accompanying drawings.

BRIEF DESCRIPTION OF THE DRAWINGS

The disclosure can be more fully understood by reading the subsequent detailed description and examples with references made to the accompanying drawings, wherein:

FIGS. 2A-2E and 4A-4E are serial cross sections of a process for manufacturing a peripheral wiring region of an array substrate in one embodiment of the disclosure.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1A:
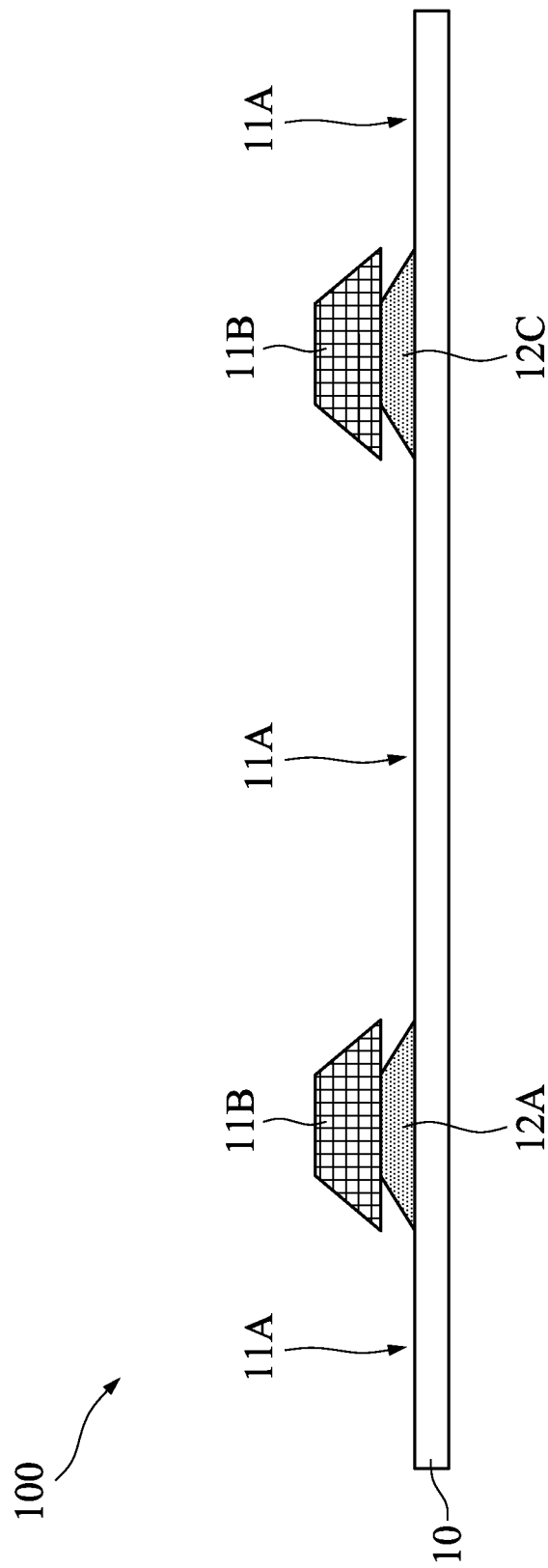
FIGS. 1A-1D, 3A-3H, 5A, and 5C-5G are serial cross sections of a process for manufacturing a display region of an array substrate in one embodiment of the disclosure.
Figure 2A:
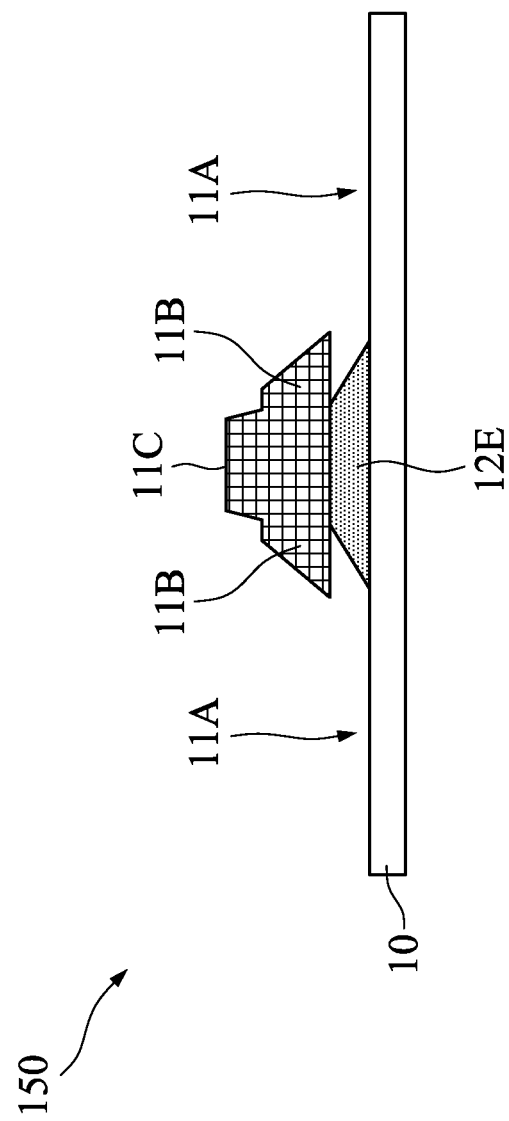

First, a conductive layer and a photoresist layer are sequentially formed on a substrate 10, and the photoresist layer is patterned by a lithography process with a multi-tone photomask to form a non-photoresist region 11A, a thin photoresist pattern 11B, and a thick photoresist pattern 11C. Subsequently, the conductive layer of the non-photoresist region is removed to expose the substrate 10. As shown in FIGS. 1A and 2A, the patterned conductive layer in a display region 100 includes a gate electrode 12A, a bottom electrode 12C of a storage capacitor. The patterned conductive layer in a peripheral wiring region 150 includes a bottom conductive line 12E. The thin photoresist pattern 11B corresponds to the patterned conductive layer such as the gate electrode 12A, the bottom electrode 12C, and a wiring region 121A of the bottom conductive line 12E. The thick photoresist pattern 11C corresponds to a contact region 121B of the bottom conductive line 12E. For illustration of the wiring region 121A and the contact region 121B of the bottom conductive line 12E, reference may be made to FIG. 2F.

The substrate 10 includes a rigid inorganic material, such as a transparent material (e.g. glass, quartz, or the likes) or an opaque material (such as wafer, ceramic, metal, alloy, or the likes). Alternatively, the substrate 10 includes a flexible organic material such as plastic, rubber, polyester, polycarbonate, or the likes. In addition, the substrate 10 can be a composite of the described organic and inorganic materials, or a stack structure of the organic materials and/or the inorganic materials. In some embodiments, the substrate 10 of the transparent material and thin film transistor products containing the same can be applied in transmissive liquid crystal displays, reflective liquid crystal displays, transflective liquid crystal displays, or self illumination displays. In other embodiments, the substrate 10 of the opaque material or poorly transparent material and thin film transistor products containing the same can be only applied in reflective liquid crystal displays or self illumination displays.

The conductive layer includes metal, alloy, or multi-layered structures thereof. In some embodiment, the conductive layer can be single-layered structures or multi-layered structures of molybdenum, aluminum, copper, titanium, gold, silver, or alloys thereof. The conductive layer can be formed by physical vapor deposition (PVD), chemical vapor deposition (CVD), sputtering, or the likes. The lithography process includes photoresist coating (e.g., spin-on coating), soft baking, photomask aligning, exposure, post-exposure baking, developing the photoresist, rinsing, drying (e.g., hard baking), other suitable processes, and/or combinations thereof. The photoresist layer can be formed by spin-on coating, slit coating, roll coating, inkjet coating, spray coating, or the likes. The conductive layer can be removed by etching, e.g. dry etching, wet etching, or combinations thereof.

The multi-tone photomask can be a stack layer photomask or a grey level photomask. It should be understood that the photomask has a transparent region corresponding to the non-photoresist region 11A, a semi-transparent region corresponding to the thin photoresist pattern 11B, and a light-shielding region corresponding to the thick photoresist pattern 11C, respectively, when the patterned photoresist layer is composed of a positive photoresist. Similarly, the photomask has a light-shielding region corresponding to the non-photoresist region 11A, a semi-transparent region corresponding to the thin photoresist pattern 11B, and a transparent region corresponding to the thick photoresist pattern 11C, respectively, when the patterned photoresist layer is composed of a negative photoresist. In short, the photomasks for the positive and negative photoresist layers have opposite patterns, respectively.

Figure 1B:
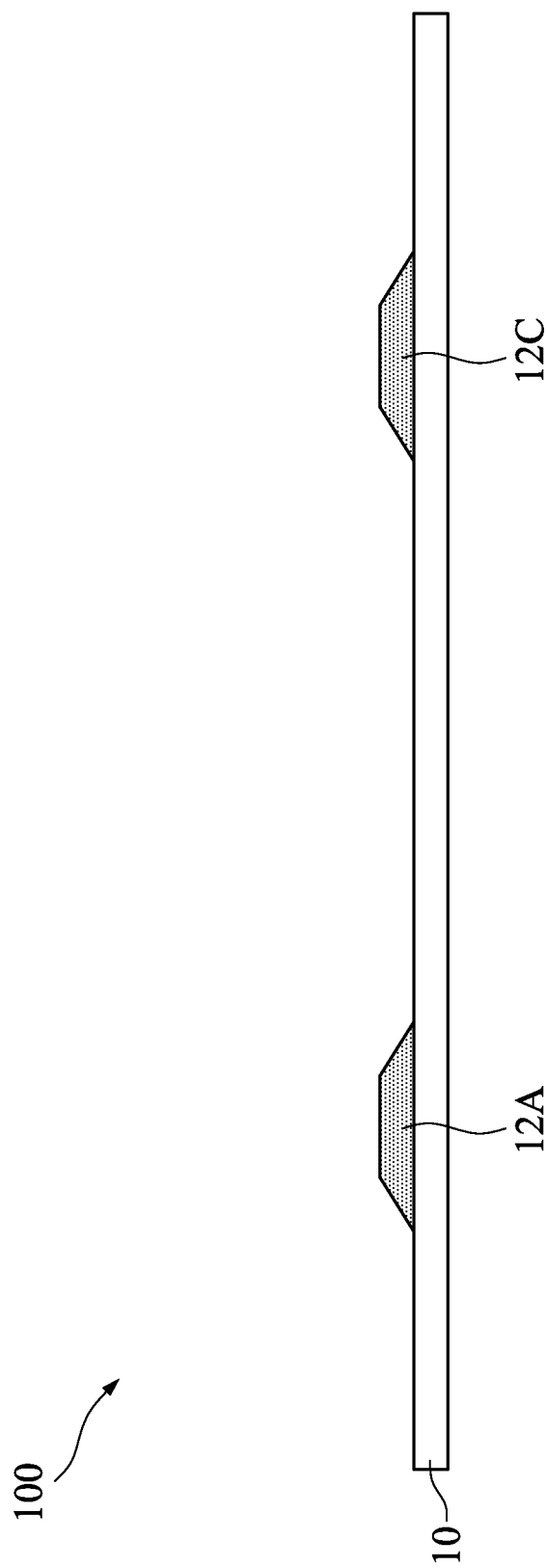

The thin photoresist pattern 11B is then ashed, thereby exposing the gate electrode 12A and the bottom electrode 12C as shown in FIG. 1B, and exposing the wiring region 121A of the bottom electrode 12E as shown in FIG. 2B, respectively. This ashing step can be performed by oxygen plasma at a temperature of room temperature to 200° C. An overly high ashing temperature may char the photoresist layer and make it difficult to remove in later processes. An overly low ashing temperature may slow the ashing rate, and therefore increase its process period. The ashing step can completely ash the thin photoresist pattern 11B and partially ash the thick photoresist pattern 11C. Because the ashing step is an isotropic removal step, the thick photoresist pattern 11C preferably has a larger profile (or area) than its corresponding region, e.g. the contact region 121B of the bottom conductive line 12E. For example, when the thin photoresist pattern 11B has a thickness of 10 μm, the thick photoresist pattern 11C has a first profile edge, and the contact region 121B of the bottom conductive line 12E has a second profile edge, and the first and second profile edges should have a distance of 10 μm. As such, the ashing step will not shrink the contact region 121B of the bottom conductive line 12E.

Figure 1C:
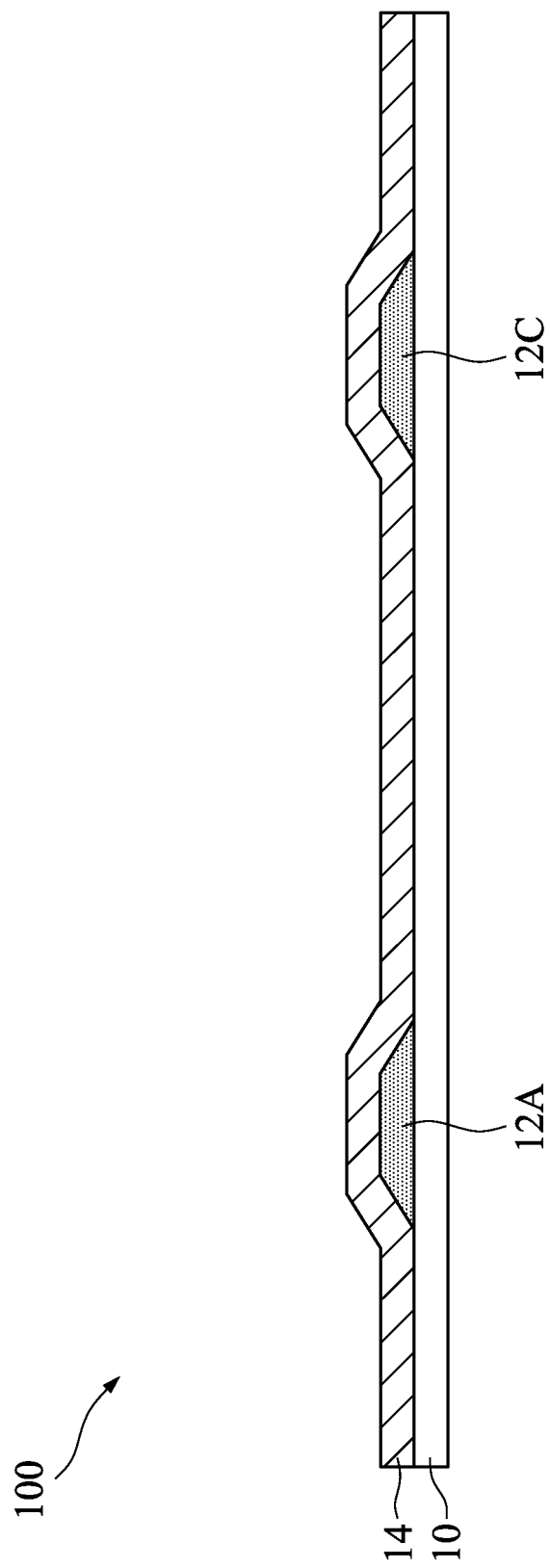
Figure 1E:
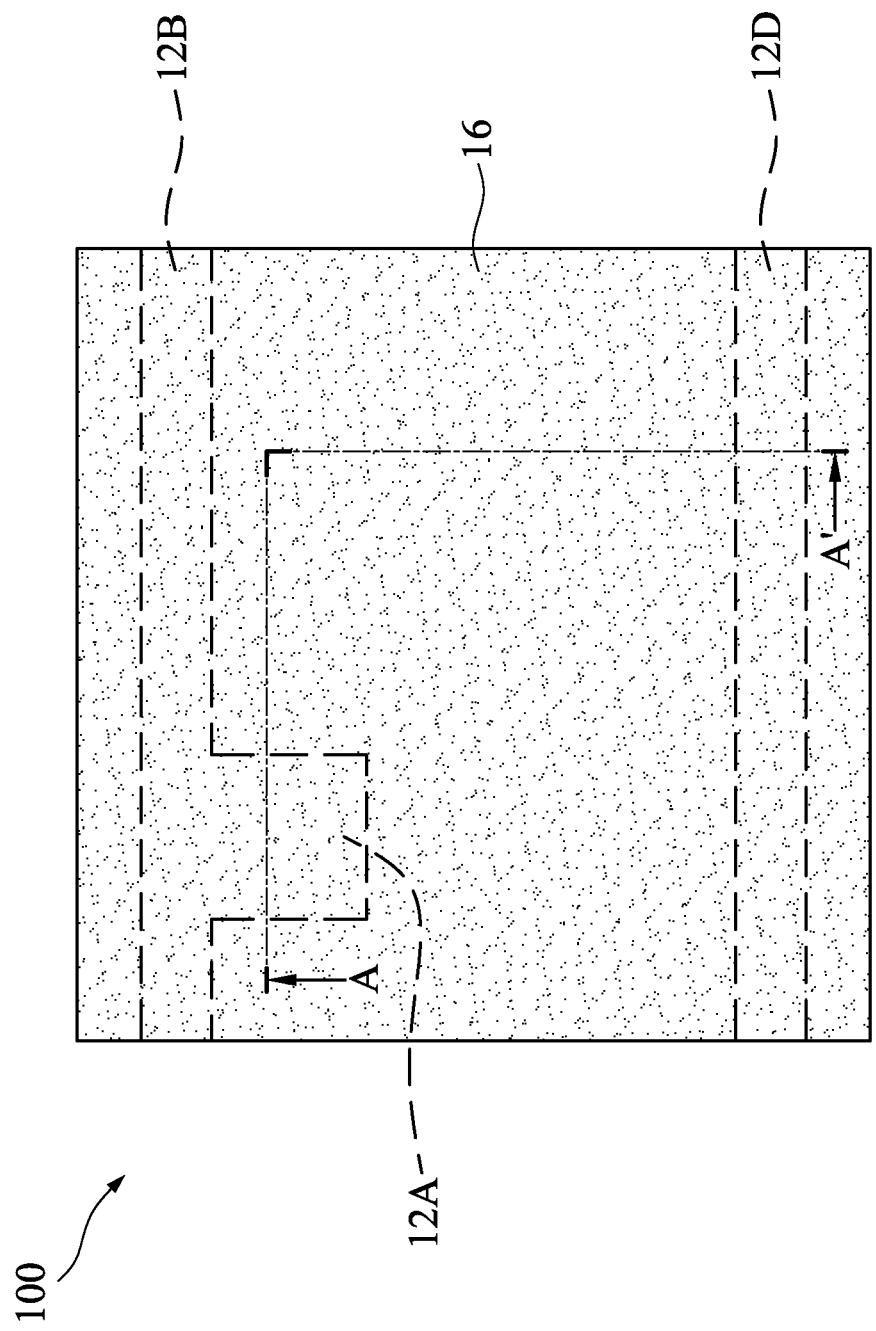
FIGS. 1E, 3I, and 5B are serial top views of a process for manufacturing a display region of an array substrate in one embodiment of the disclosure.
Figure 2C:
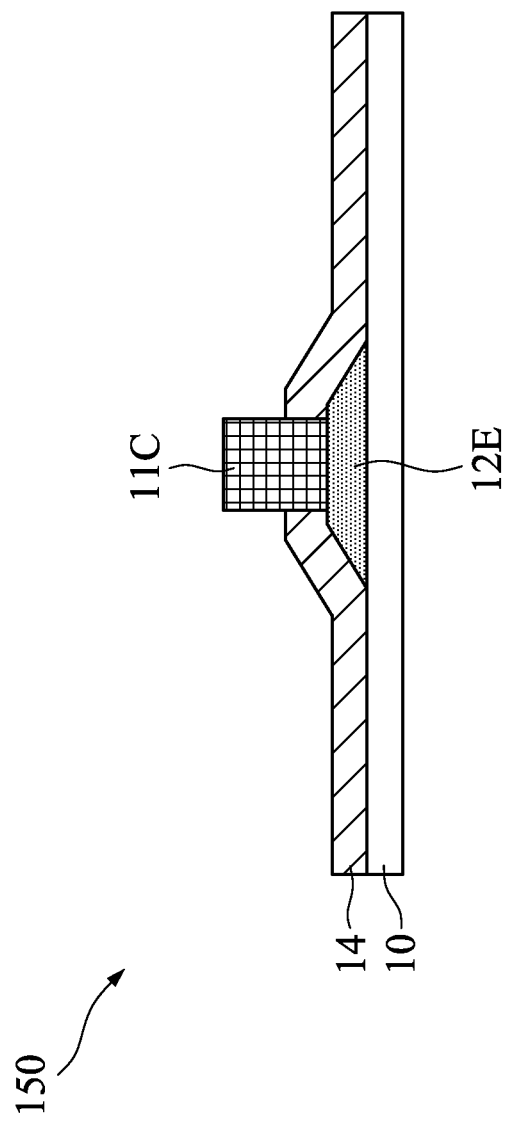

The insulation layer 14 is then selectively deposited on the substrate 10, the gate electrode 12A, the gate line 12B, and the common line 12D (referred to FIG. 1E), the bottom electrode 12C, and the wiring region 121A of the bottom conductive line 12E (referred to FIG. 2F), as shown in FIGS. 1C and 2C. In other words, the insulation layer 14 is deposited on all regions other than the thick photoresist pattern 11C. The selective deposition process can be performed by an atomic layer deposition (ALD) at a temperature of room temperature to 200° C. An overly high depositing temperature may char the photoresist layer and make it difficult to be removed in later processes. An overly low depositing temperature may form particular defects or a non-dense coating film during the deposition process. The ALD has several properties, which is listed as follows. First, ALD may form a dense coating film with a complete step coverage, such that the gate insulation film may have a high quality. Second, the ALD may selectively deposit the coating film on suitable regions other than on the organic surface under appropriate conditions. Contact holes can be directly formed after stripping the photoresist layer, and the stripping process will not cause the coating film to peel. As such, the problems such as polluting the array substrate or obstructing the stripper pipes due to the stripping of the coating film can be avoided. The insulation layer 14 includes aluminum oxide, lanthanum oxide, hafnium oxide, hafnium oxynitride, zirconium oxide, other materials suitable for the selective deposition, or multi-layered structures thereof.

Figure 1D:
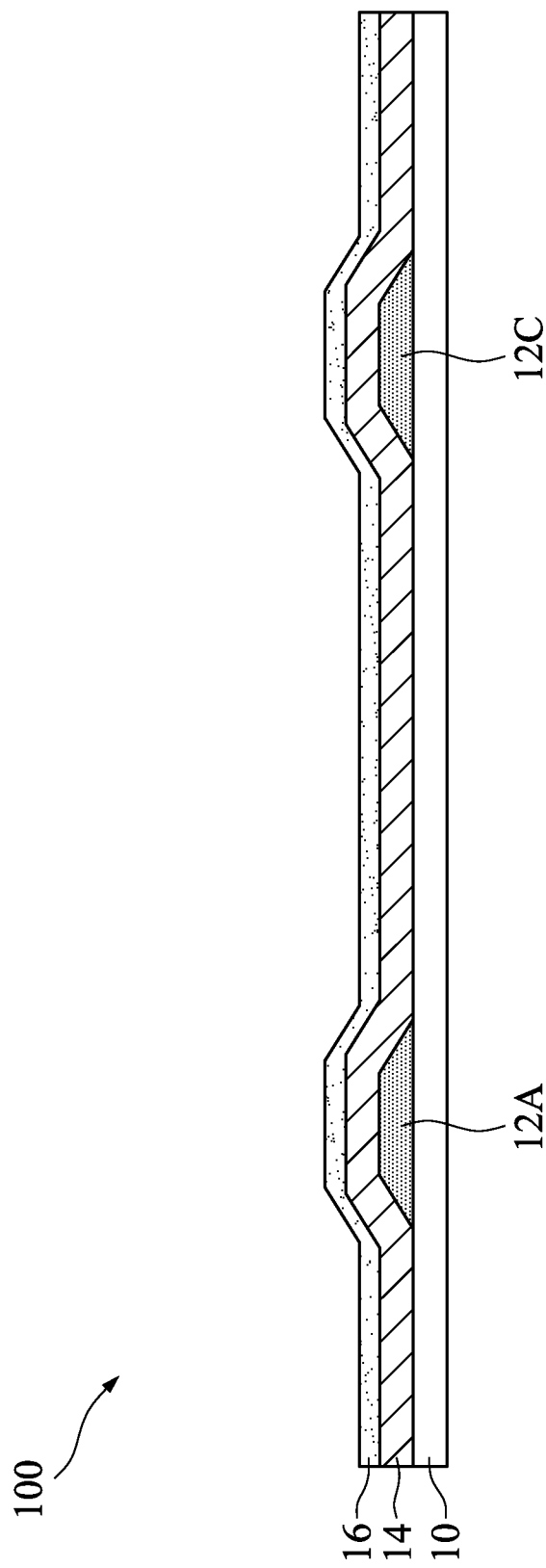
Figure 2D:
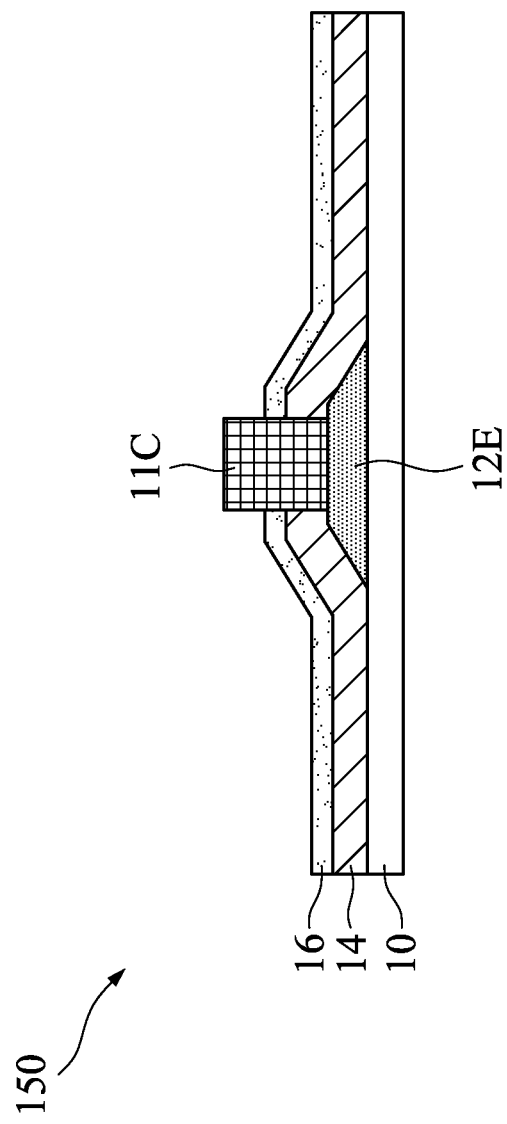

A semiconductor layer 16 is then selectively deposited on the insulation layer 14, as shown in FIGS. 1D and 2D. In other words, the semiconductor layer 16 is not deposited on the thick photoresist pattern 11C. The semiconductor layer 16 can be zinc oxide, indium oxide, indium gallium zinc oxide, tin oxide, or other materials suitable for the selective deposition. A process temperature of the selective deposition can be controlled as previously described and further description is omitted here.

Figure 2E:
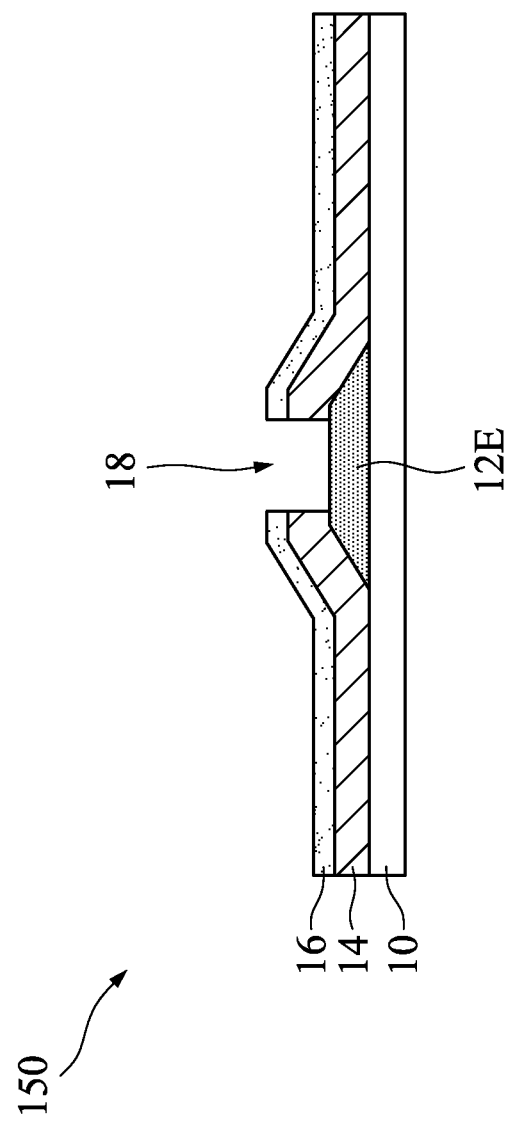

The remaining thick photoresist pattern 11C is then removed to form a contact hole 18 exposing the contact region 121B of the bottom conductive line 12E, as shown in FIG. 2E. Because the display region 100 is free of the thick photoresist pattern 11C, this removing step will not influence the structure as shown in FIG. 1D. The removal can be performed by the described ashing step or a conventional wet stripping process. It should be understood that a cross-sectional view of a cross-section line A-A' in FIG. 1E is shown in FIG. 1D, and a cross-sectional view of a cross-section line B-B' in FIG. 2F is shown in FIG. 2E.

Figure 2F:
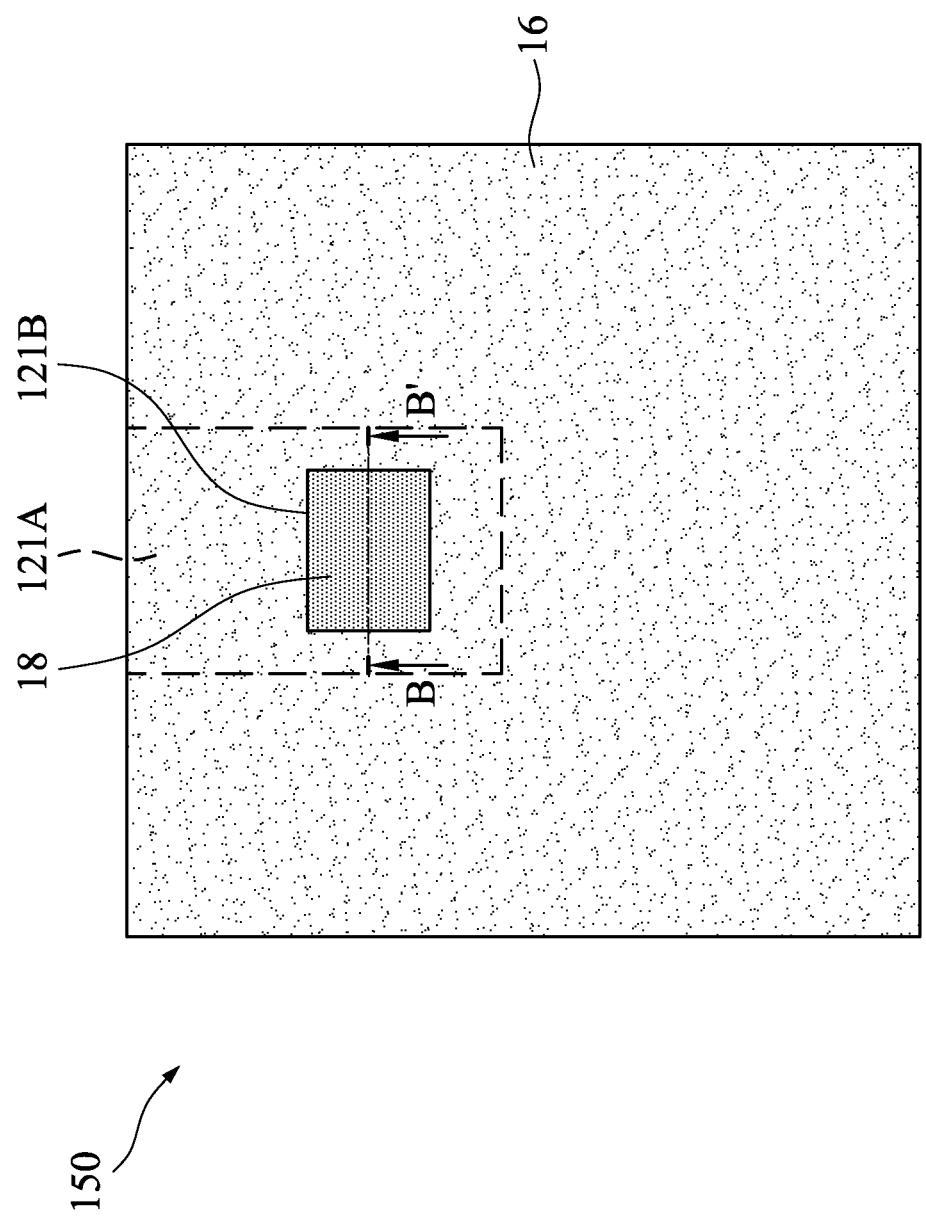
FIGS. 2F and 4F are serial top views of a process for manufacturing a peripheral wiring region of an array substrate in one embodiment of the disclosure.

As shown in FIGS. 1E and 2F, the patterned conductive layer only serves as the gate electrode 12A, the gate line 12B connecting to the gate electrode 12A, and the common line 12D (a part of the common line served as the bottom electrode 12C of a predetermined storage capacitor) in the display region 100 and the bottom conductive line 12E of the peripheral wiring region 150. However, the patterned conductive layer may serve as a contact pad or other elements if necessary. As shown in FIG. 1E, the gate line 12B and the common line 12D are alternately arranged in parallel.

Figure 3A:
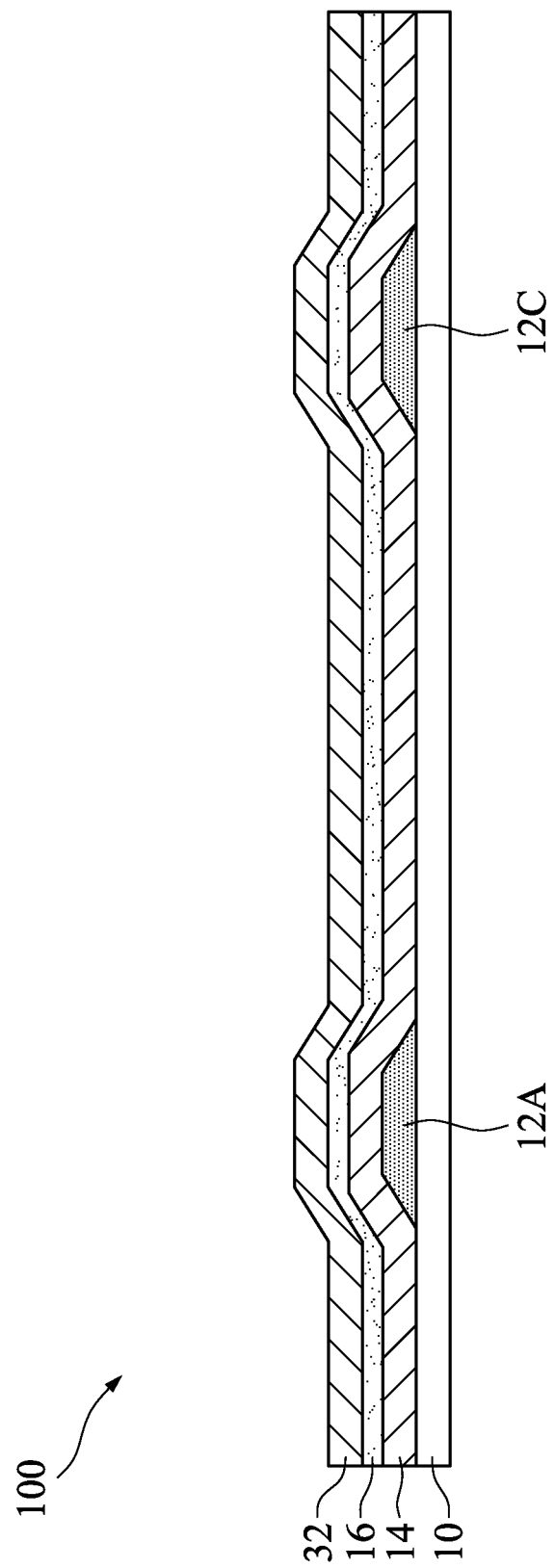

As shown in FIG. 3A, a conductive layer 32 is then formed on the semiconductor layer 16 and on a bottom and sidewalls of the contact hole 18. The conductive layer 32 includes metal, alloy, or multi-layered structures thereof, such as a stack of molybdenum/aluminum/molybdenum, molybdenum/copper, molybdenum/copper/molybdenum, or titanium/copper. The conductive layer 32 can be formed by evaporation, sputtering, PVD, or CVD processes.

Figure 3B:
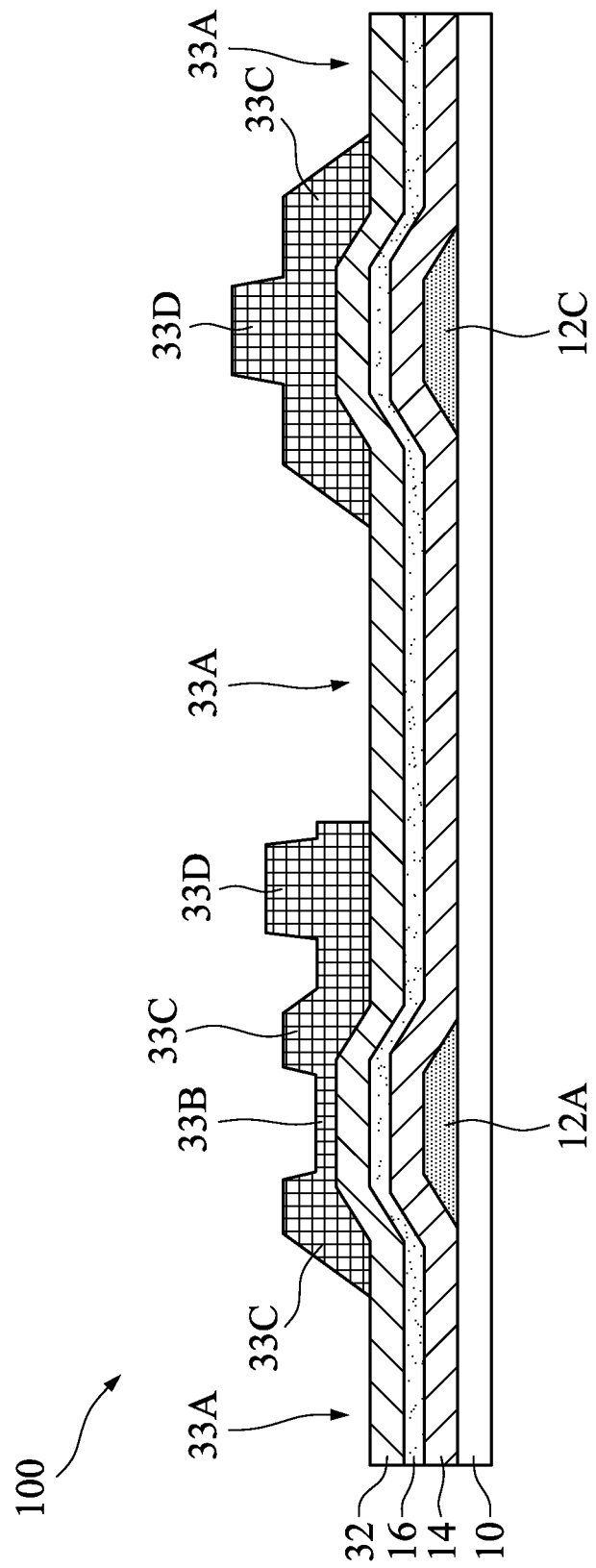
Figure 4A:
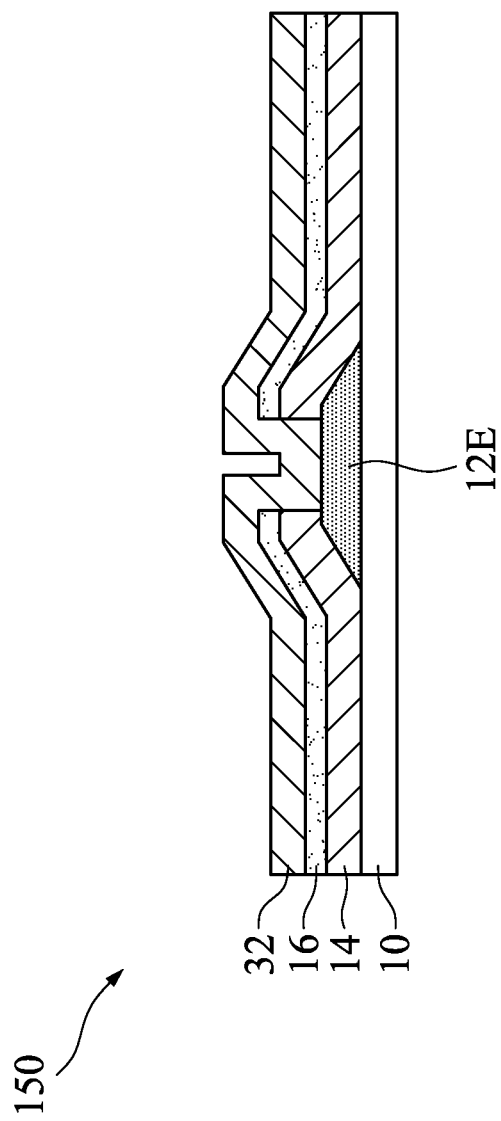
Figure 4B:
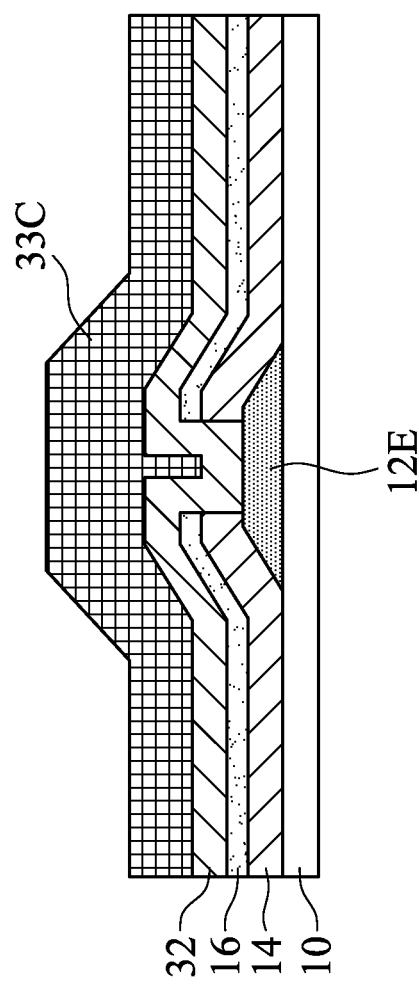

A photoresist layer is then formed on the conductive layer 32 and patterned by a lithography process with a multi-tone photomask to form a non-photoresist region 33A, a thin photoresist pattern 33B, a sub-thick photoresist pattern 33C, and a thick photoresist pattern 33D, as shown in FIGS. 3B and 4B. The composition and formation of the photoresist layer is similar to that previously described, and thus, further description is omitted here. It should be understood that the photomask has different regions of different transparency as below when the photoresist layer is composed of a positive photoresist. The photomask has a transparent region corresponding to the non-photoresist region 33A. The photomask has semi-transparent regions corresponding to the thin photoresist pattern 33B and the sub-thick photoresist pattern 33C, wherein the semi-transparent region corresponds to the thin photoresist pattern 33B has a higher transparency than the semi-transparent region corresponds to the sub-thick photoresist pattern 33C. The photomask has a light-shielding region corresponding to the thick photoresist pattern 33D. Alternatively, the photomask has different regions of different transparency as below when the photoresist layer is composed of a negative photoresist. The photomask has a light-shielding region corresponding to the non-photoresist region 33A. The photomask has semi-transparent regions corresponding to the thin photoresist pattern 33B and the sub-thick photoresist pattern 33C, wherein the semi-transparent region corresponds to the sub-thick photoresist pattern 33C has a higher transparency than the semi-transparent region corresponds to the thin photoresist pattern 33B. The photomask has a transparent region corresponding to the non-photoresist pattern 33D. In short, the photomasks for the positive and negative photoresist layers have opposite patterns, respectively.

Figure 3C:
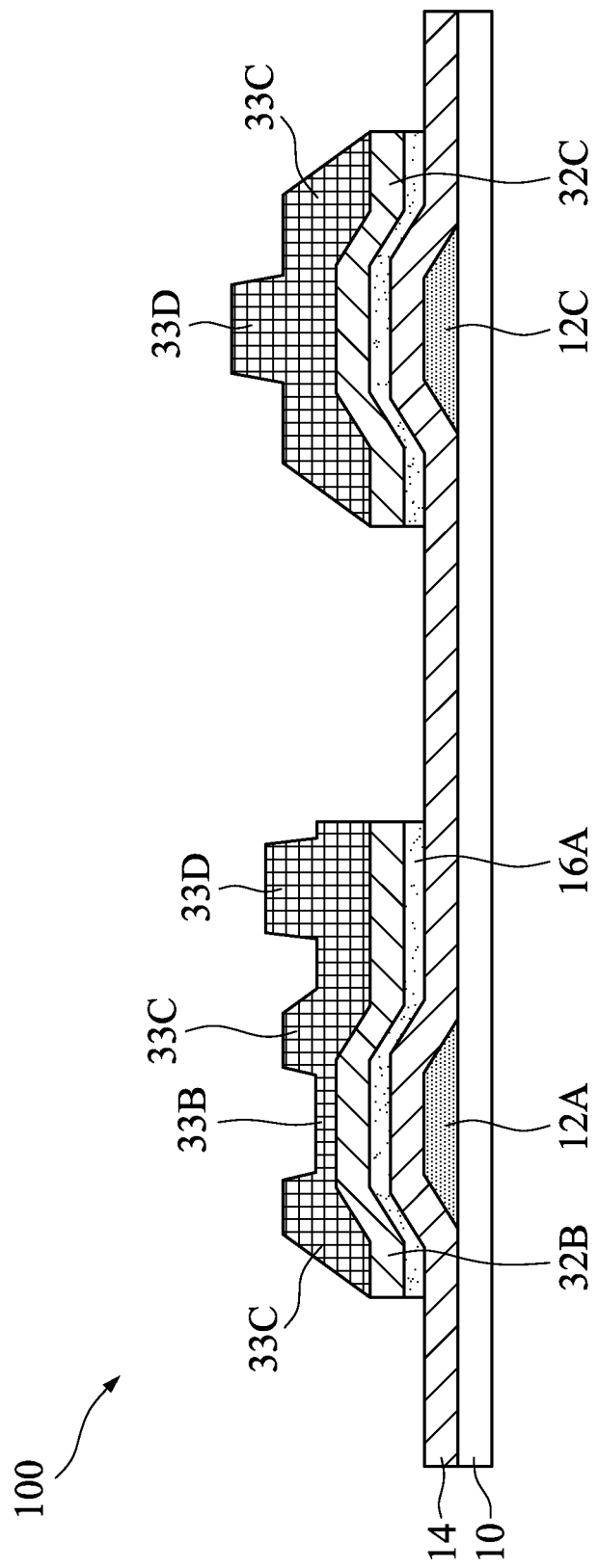
Figure 3I:
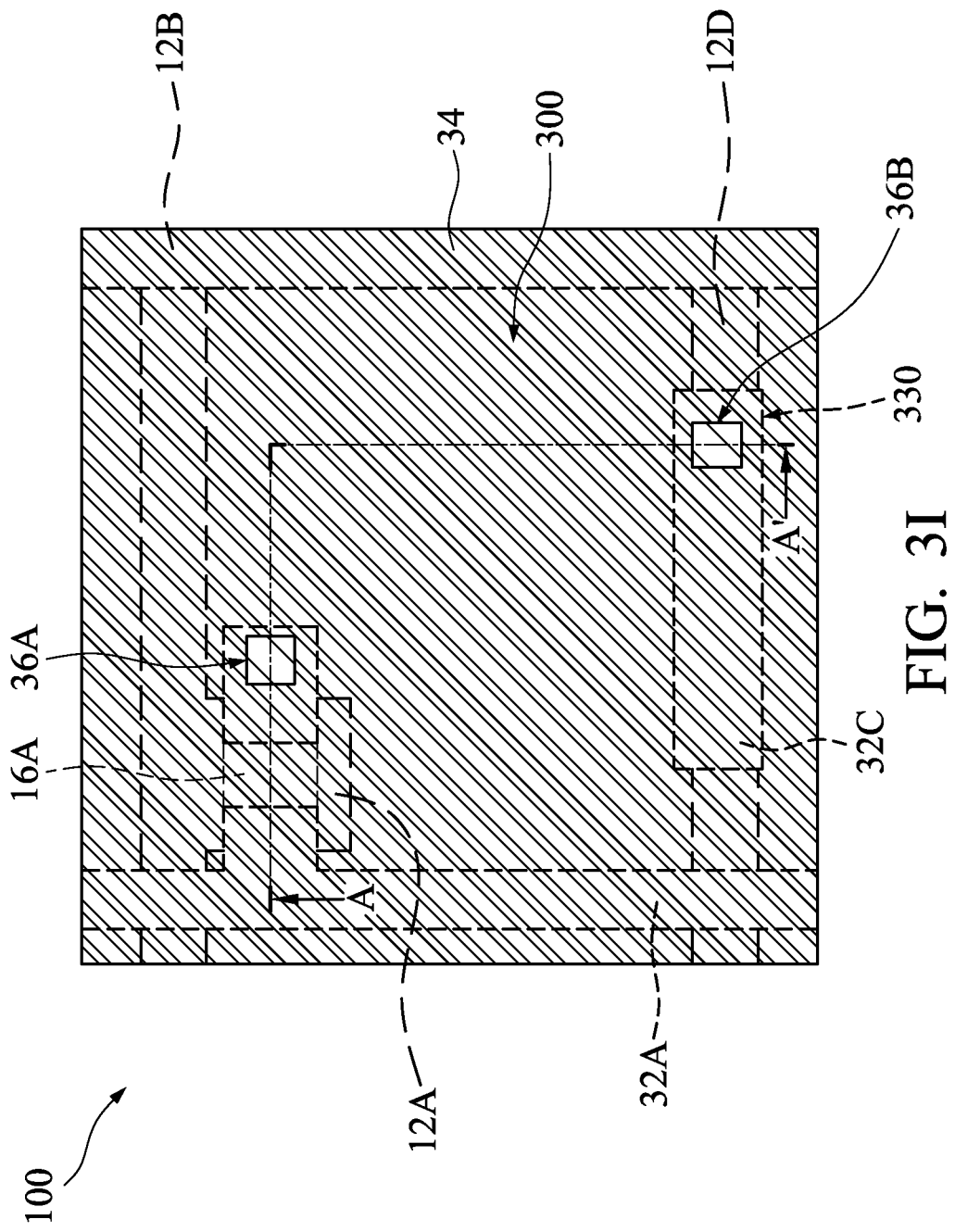
Figure 4C:
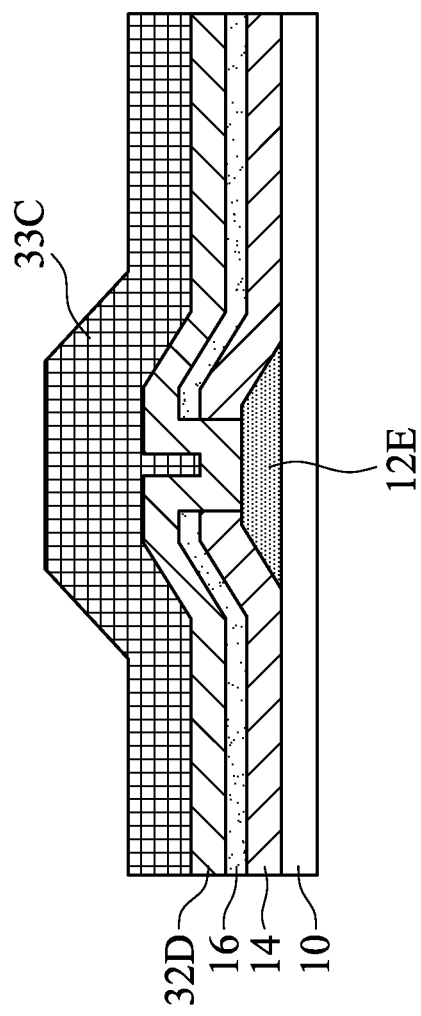

The conductive layer 32 and the semiconductor layer 16 of the non-photoresist region 33A are then removed, as shown in FIGS. 3C and 4C. The conductive layer 32 and the semiconductor layer 16 can be removed by a dry etching, wet etching process, or combinations thereof. The etching step may simultaneously define a data line 32A (referred to FIG. 3I), a conductive pattern 32B connecting to the data line 32A, a channel layer 16A, and a top electrode 32C in the display region 100, and a top conductive line 32D (referred to FIG. 4F) in the peripheral wiring region 150. In the display region 100, the data lines 32A vertically cross the gate lines 12B to define a pixel region 300 (referred to FIG. 3I). The channel layer 16A is interposed between the conductive pattern 32B and the gate electrode 12A. The top electrode 32C covers a part of the common line 12D (such as the bottom electrode 12C) to define a storage capacitor 330. In the peripheral wiring region 150, the top conductive line 32D connects to the bottom conductive line 12E. In a contact region of a conventional peripheral wiring region, a top conductive line connects to a bottom conductive line through other conductive material such as ITO. However, the top conductive line 32D directly connects the bottom conductive line 12E through the contact hole 18 of the insulation layer 14, and there is no transparent material such as ITO interposed between the top conductive line 32D and the bottom conductive line 12E.

Still referring to FIGS. 3C and 4C, the thin photoresist pattern 33B corresponds to a center part of the gate electrode 12A. The sub-thick photoresist pattern 33C corresponds to two sides of the conductive pattern 32B, the data line 32A, and the top electrode 32C in the display region 100, and the top conductive line 32D in the peripheral wiring region 150. The thick photoresist pattern 33D corresponds to predetermined contact holes of a drain electrode and the top electrode 32C.

Figure 3D:
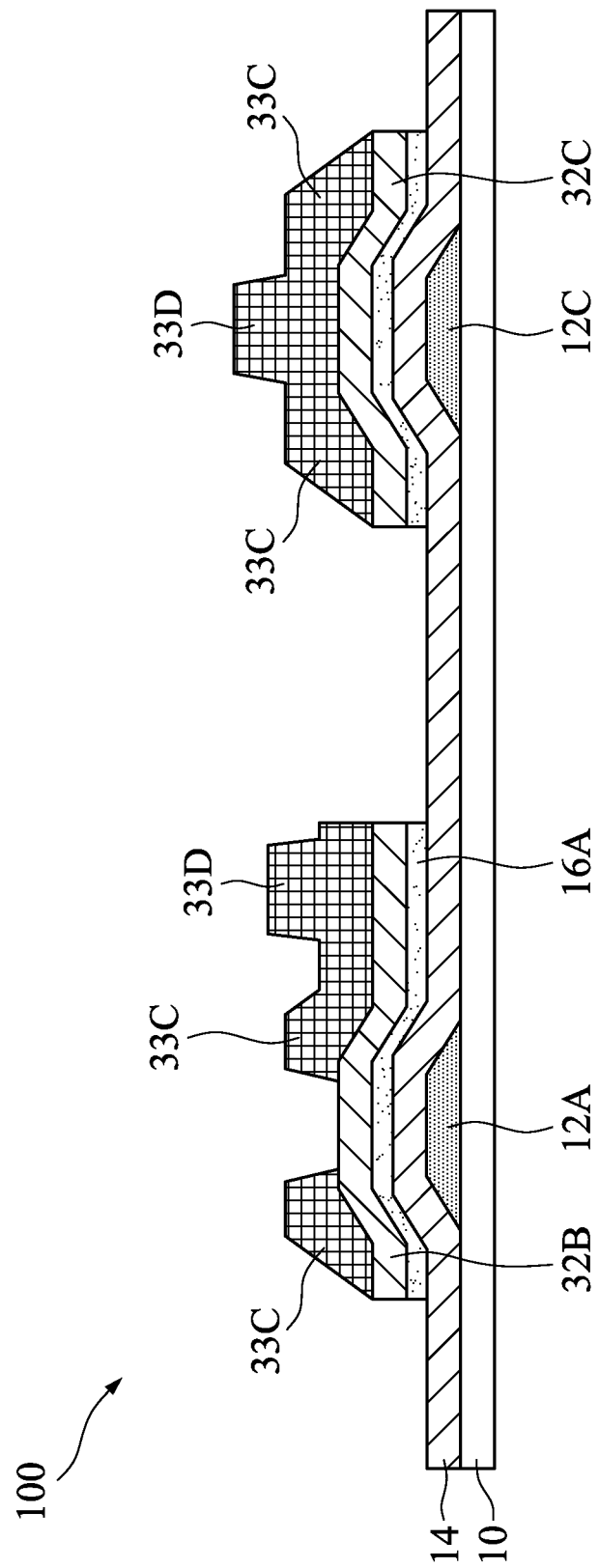

The thin photoresist pattern 33B is then ashed to expose the conductive pattern 32B on the center part of the gate electrode 12A, as shown in FIG. 3D. The conditions of the ashing step are similar to that previously described, and thus, further description is omitted here. The ashing step may totally remove the thin photoresist pattern 33B and partially remove the sub-thick photoresist pattern 33C and the thick photoresist pattern 33D. Because the ashing step is an isotropic removal step, the sub-thick photoresist pattern 33C preferably has a larger profile (or area) than its corresponding region, e.g. the two side of the conductive pattern 32B, the data line 32A, the top electrode 32C, and the top conductive line 32D. Similarly, the thick photoresist pattern 33C preferably has a larger profile (or area) than its corresponding region, e.g. predetermined contact holes of the drain electrode and the top electrode 32C.

Figure 3E:
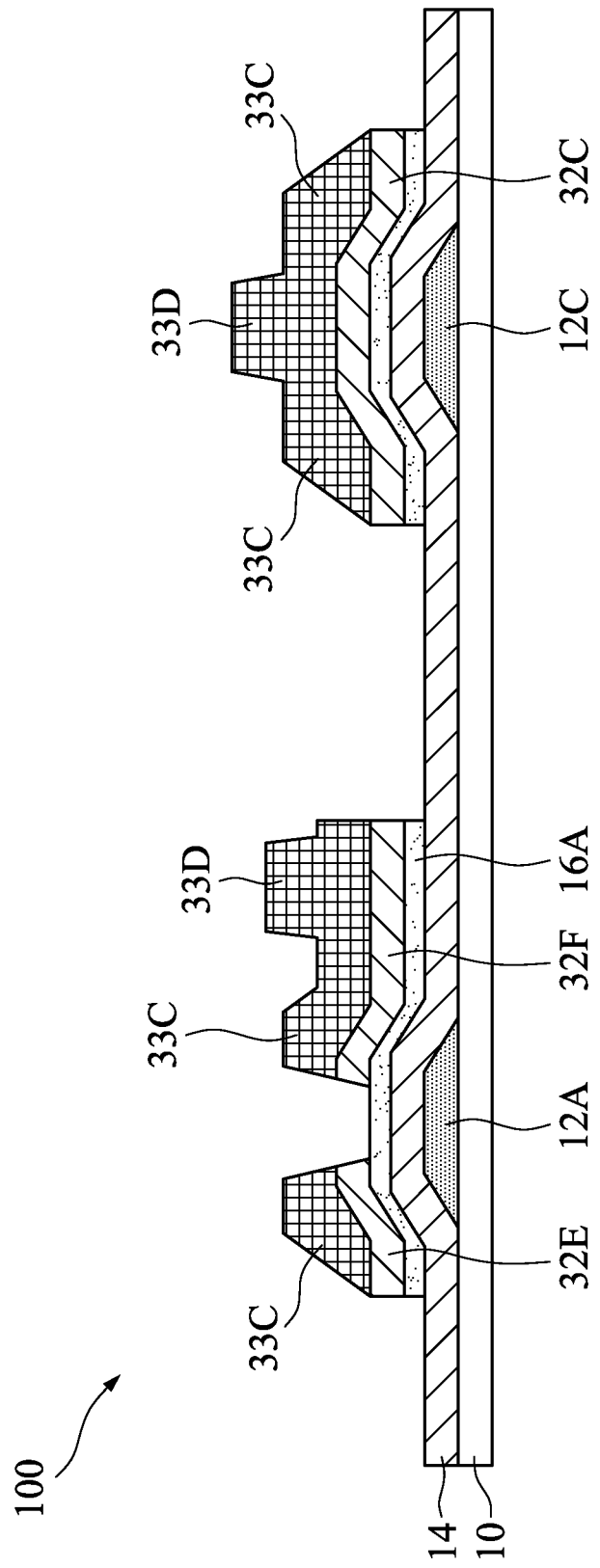

The conductive pattern 32B on the center part of the gate electrode 12A is then removed to form a source electrode 32E and a drain electrode 32F, such that the underlying channel layer 16A is exposed as shown in FIG. 3E. The part of the conductive pattern 32B can be removed by a dry etching, wet etching process, or combinations thereof.

Figure 3F:
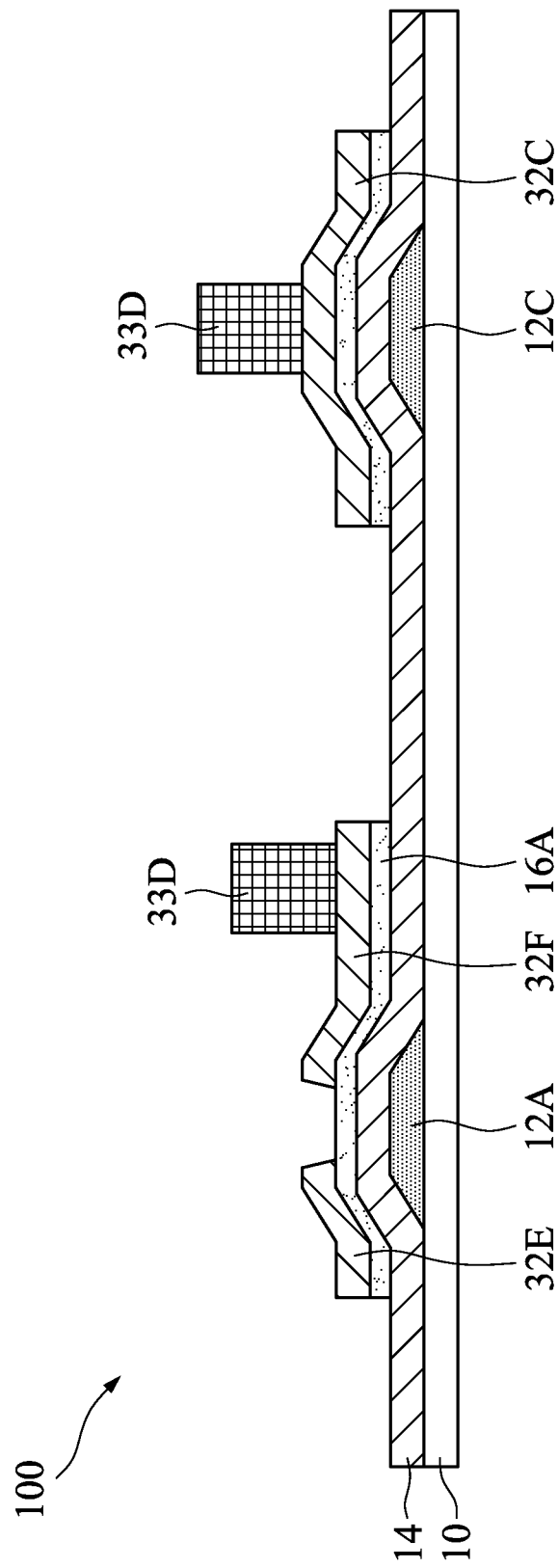
Figure 4D:
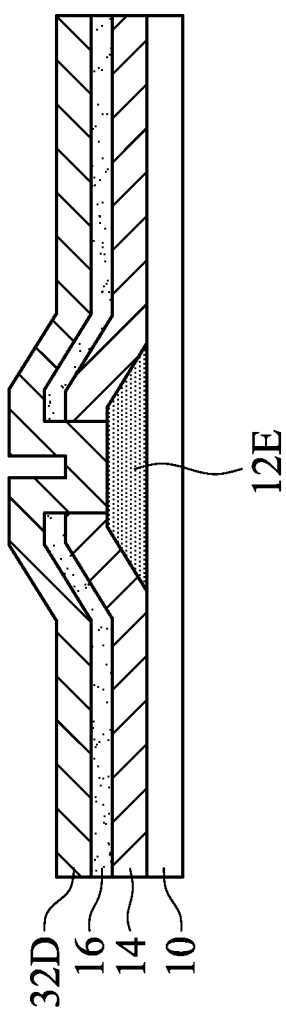

The sub-thick photoresist pattern 33C is then ashed to expose the bottom conductive line 12E, the data line 32A, the top electrode 32C, the top conductive line 32D, the source electrode 32E, and the drain electrode 32F, as shown in FIGS. 3F and 4D. The conditions of the ashing step are similar to that previously described, and thus, further description is omitted here. The ashing step may totally remove the sub-thick photoresist pattern 33C and partially remove the thick photoresist pattern 33D. Because the ashing step is an isotropic removal step, the thick photoresist pattern 33D preferably has a larger profile (or area) than its corresponding region, e.g. predetermined contact holes of the drain electrode and the top electrode 32C.

Figure 3G:
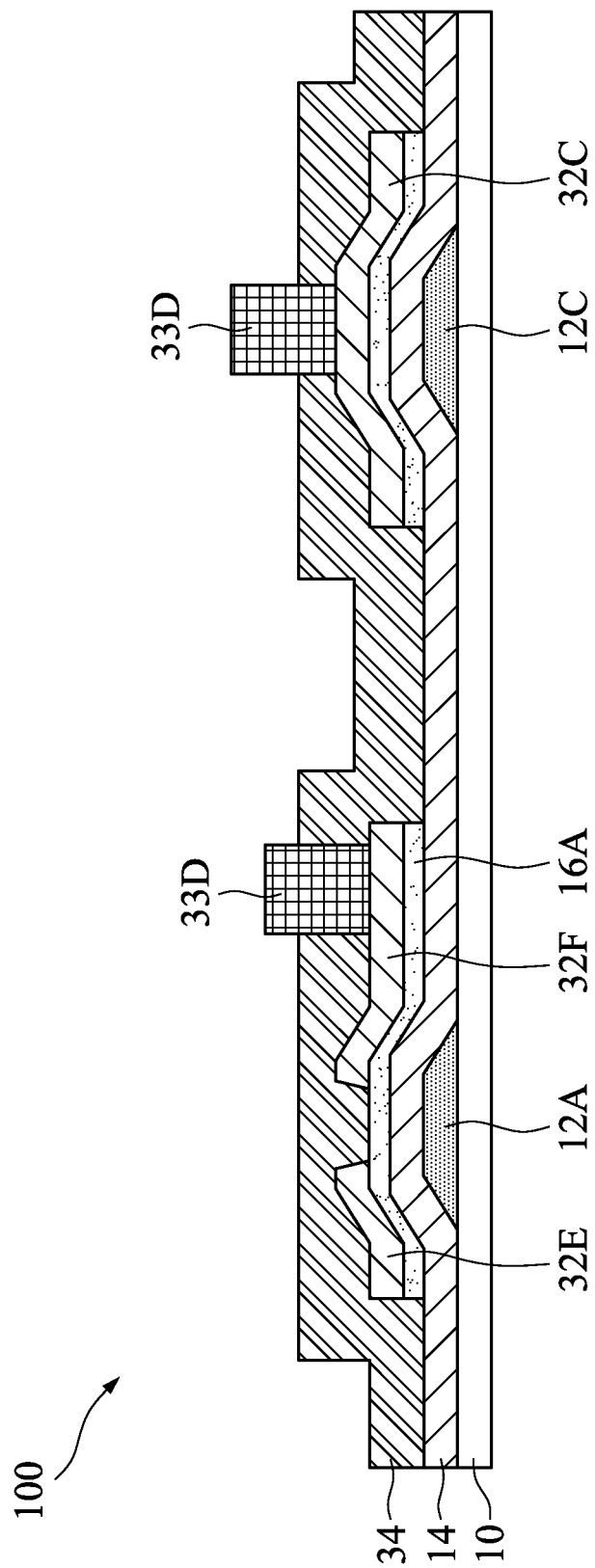
Figure 4E:
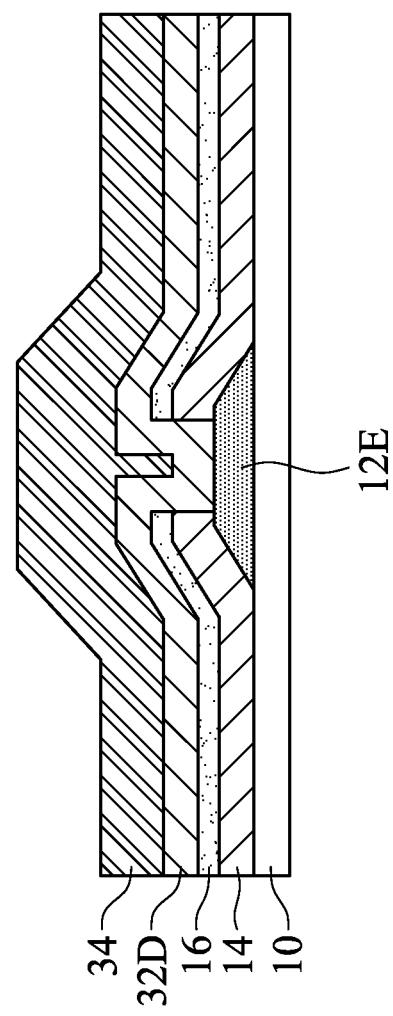

A passivation layer 34 is then selectively deposited on all regions other than the thick photoresist pattern 33D, as shown in FIGS. 3G and 4E. The composition of the passivation layer 34 is similar to the insulation layer 14, thus, further description is omitted here. In one embodiment, the selective deposition is ALD. A process temperature of the selective deposition can be controlled as previously described, thus, further description is omitted here.

Figure 3H:
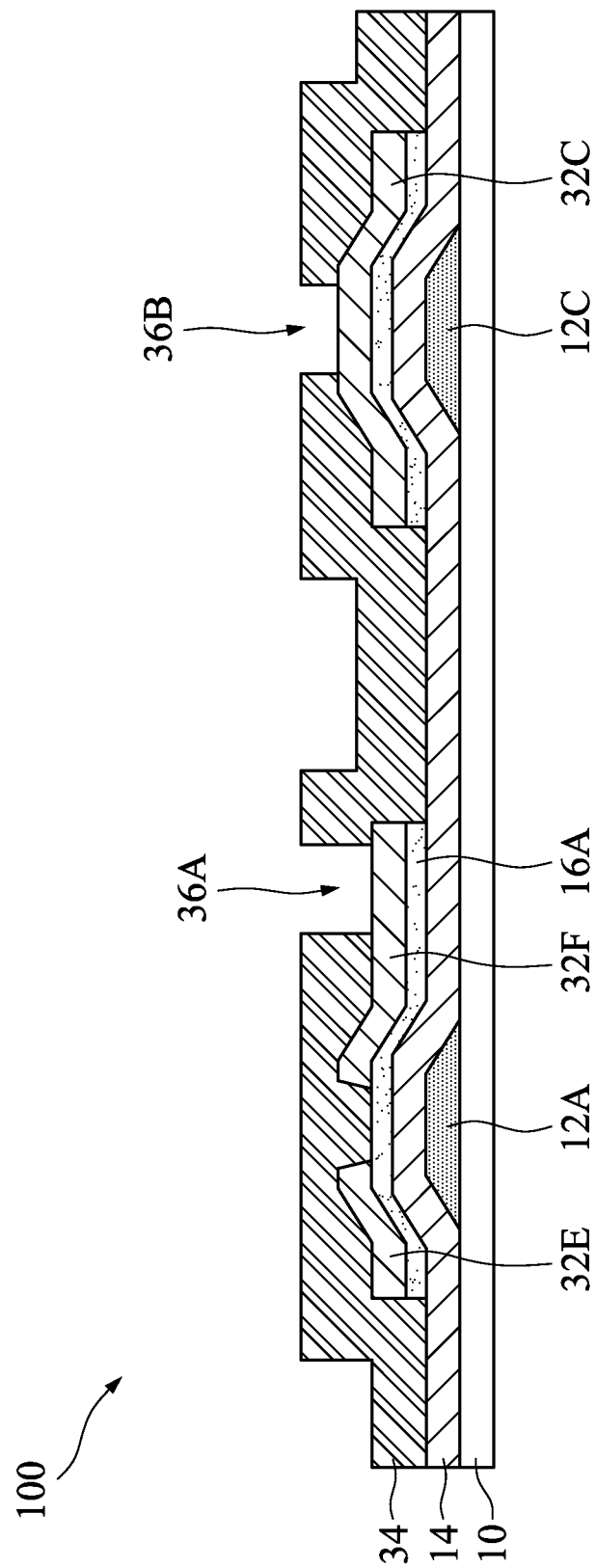
Figure 4F:
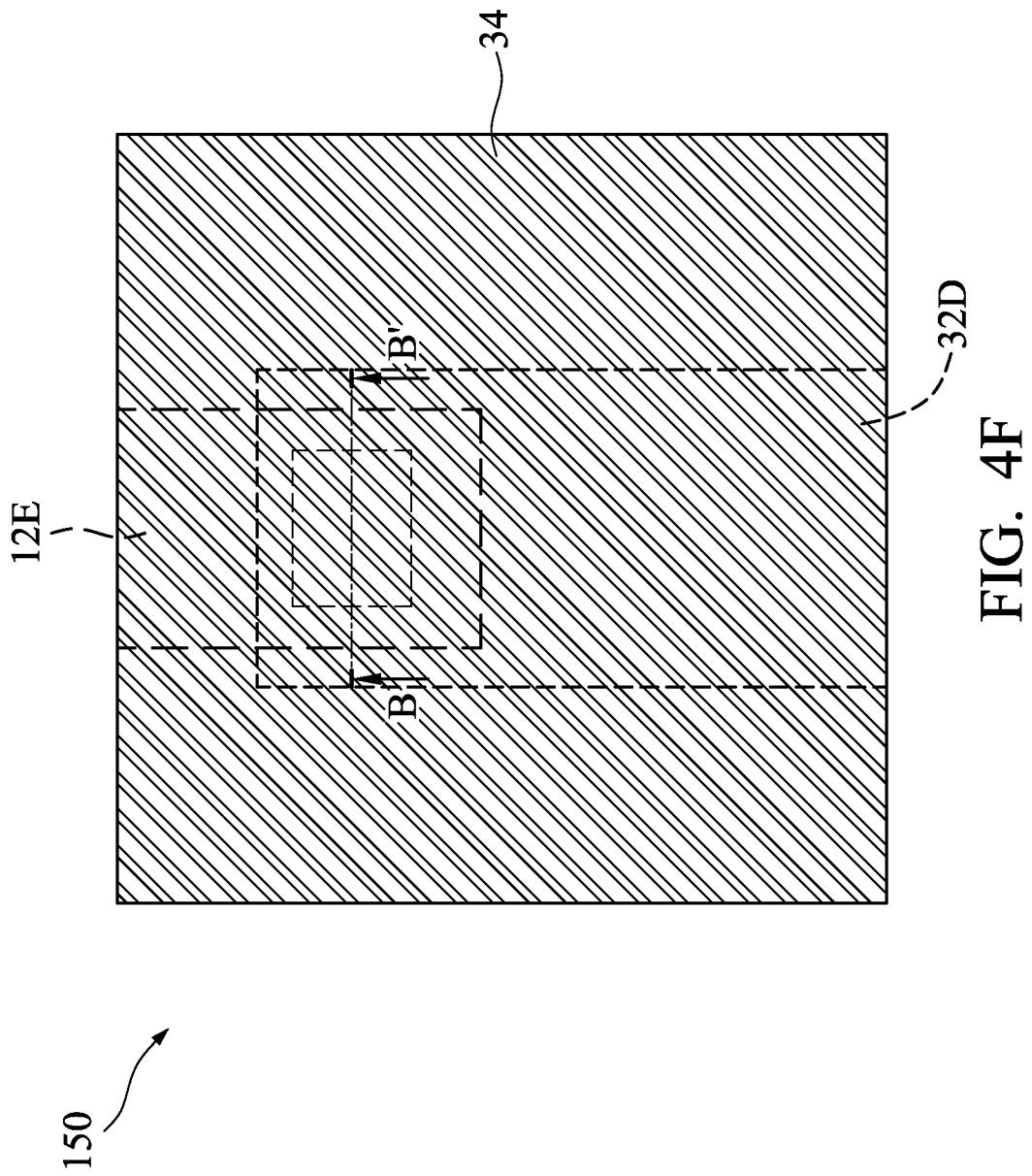

The remaining thick photoresist pattern 33D is then removed to form a drain electrode contact hole 36A and a top electrode contact hole 36B to expose a part of the drain electrode 32F and a part of the top electrode 32C, respectively, as shown in FIG. 3H. The removal process can be performed by the described ashing step or a conventional stripping. Because the peripheral wiring region 150 is free of the thick photoresist pattern 33D, this step will not influence the structure in FIG. 4E. It should be understood that a cross-sectional view of a cross-section line A-A' in FIG. 3I is shown in FIG. 3H, and a cross-sectional view of a cross-section line B-B' in FIG. 4F is shown in FIG. 4E.

Figure 5A:
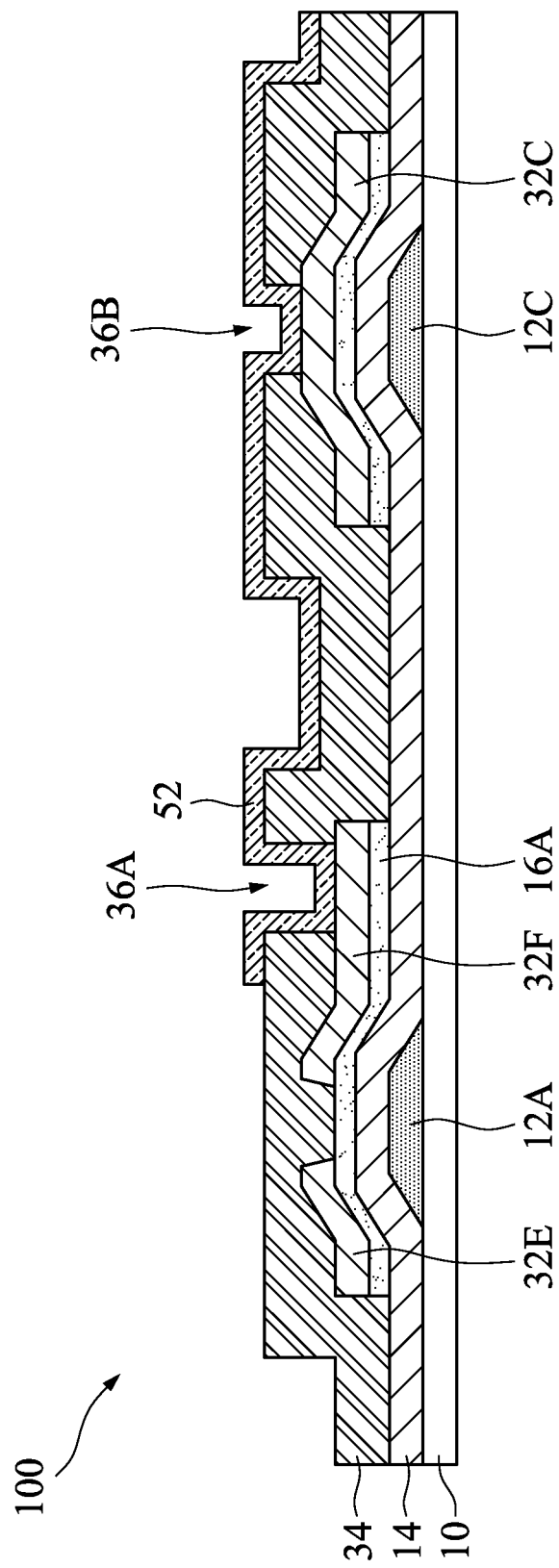
Figure 5B:
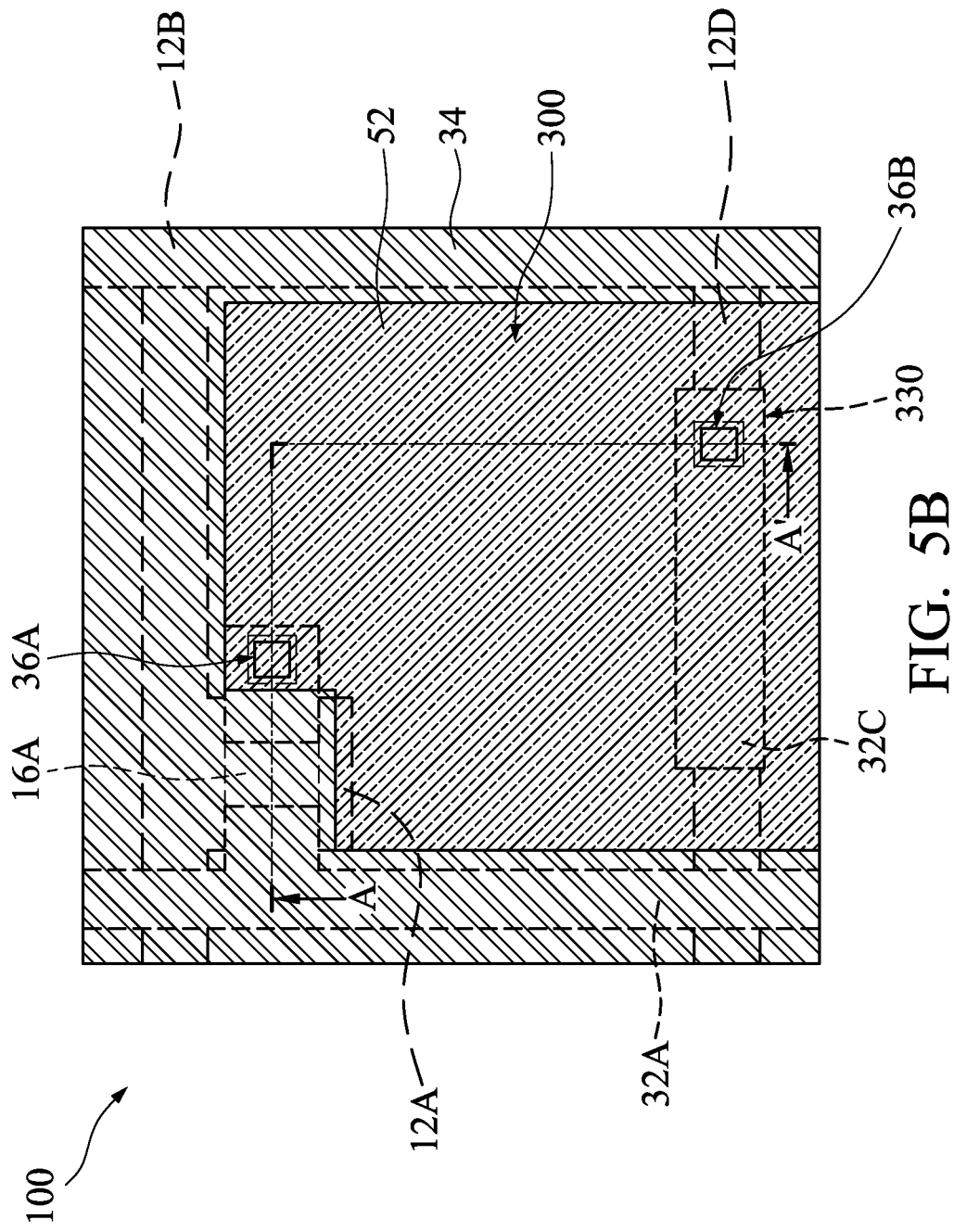

Finally, a pixel electrode pattern 52 is formed in the pixel region 300. The pixel electrode pattern 52 connects to the drain electrode 32F of the thin film transistor through the drain electrode contact hole 36A, and connects to the top electrode 32C of the storage capacitor 330 through the top electrode contact hole 36B, respectively. In one embodiment, the array substrate is applied in a transmission liquid crystal display, and the pixel electrode pattern 52 includes a transparent material such as indium tin oxide (ITO), indium zinc oxide (IZO), aluminum zinc oxide (AZO), cadmium tin oxide (CTO), tin oxide ($SnO_2$), zinc oxide (ZnO), silver nanowire, or carbonanotube (CNT). In another embodiment, the array substrate is applied in a reflection liquid crystal display, and the pixel electrode pattern 52 includes a reflective material such as aluminum, gold, tin, silver, copper, iron, lead, chromium, tungsten, molybdenum, neodymium, nitrides thereof, oxynitrides thereof, alloys thereof, or combinations thereof. In addition, the pixel electrode pattern 52 of a reflective type may have an uneven surface to increase the reflection and scattering effect of the light. It should be understood that a cross-sectional view of a cross-section line A-A' in FIG. 5B is shown in FIG. 5A.

Figure 5C:
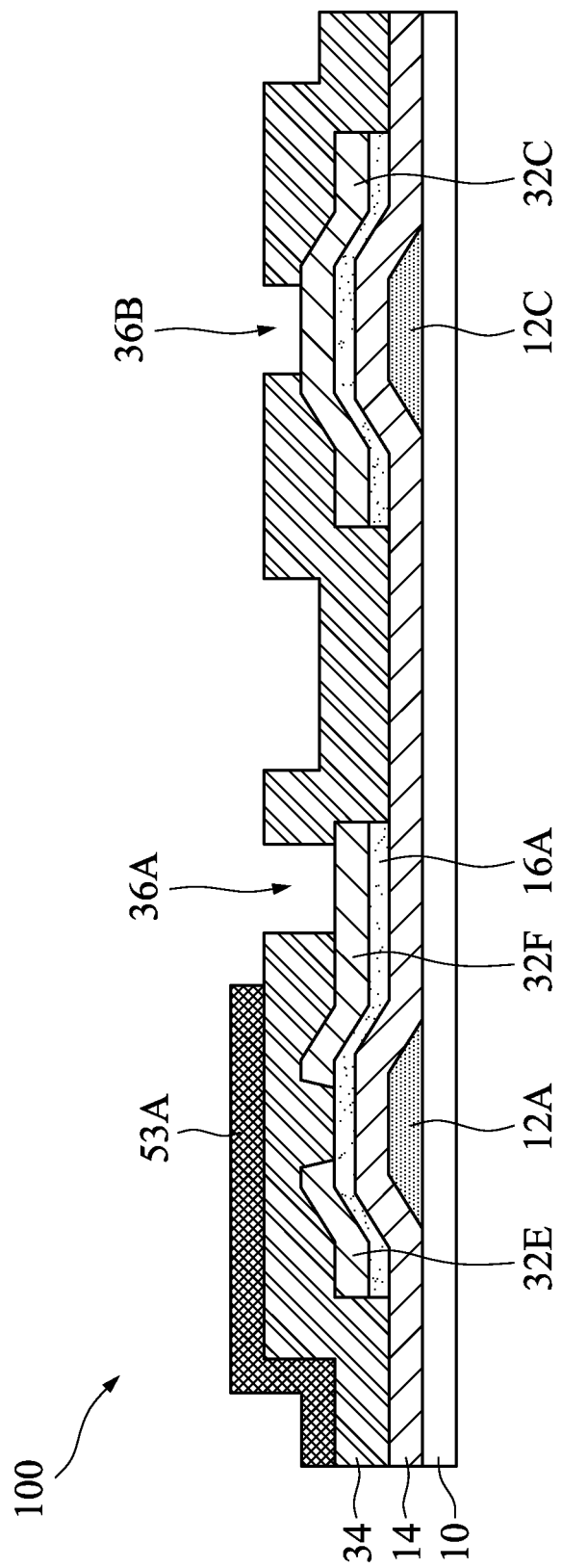
Figure 5D:
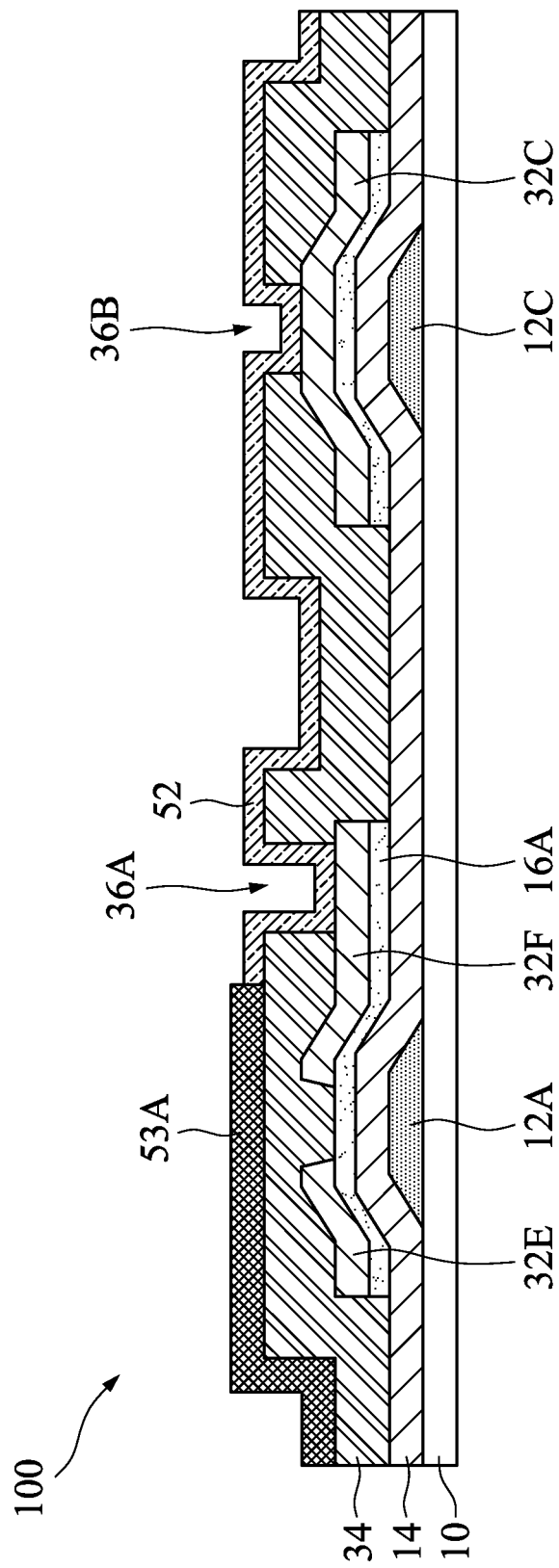
Figure 5E:
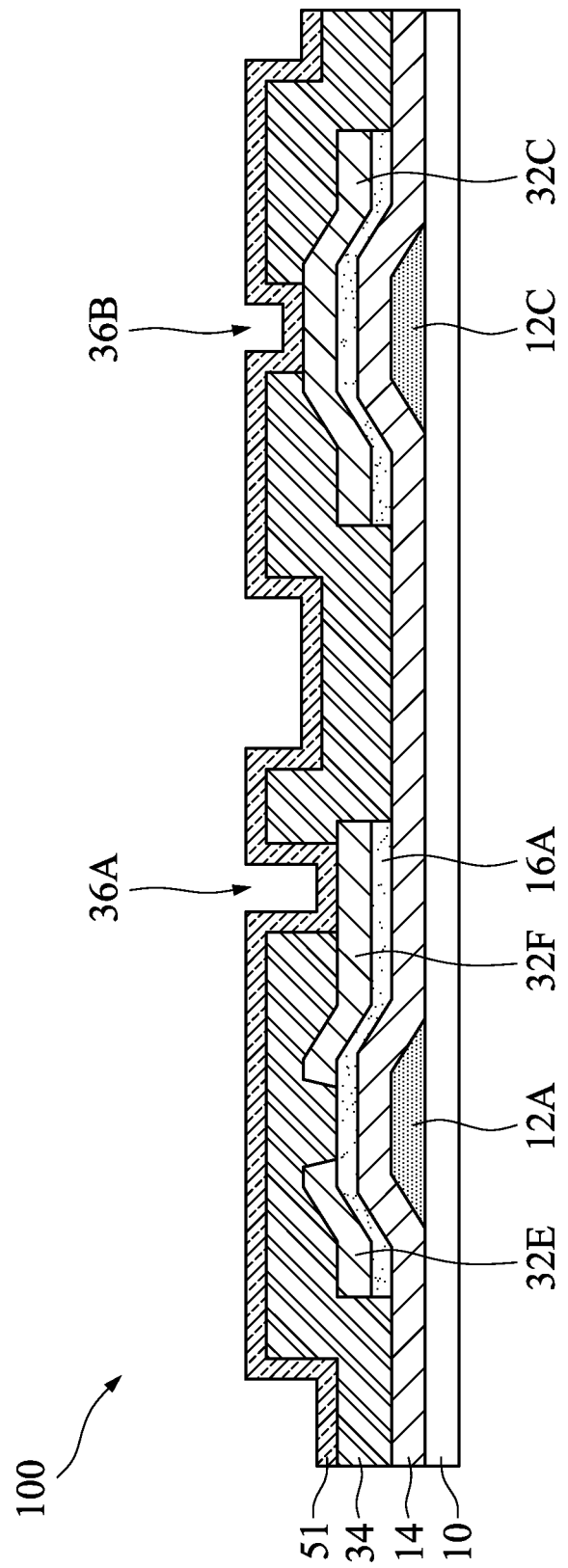
Figure 5F:
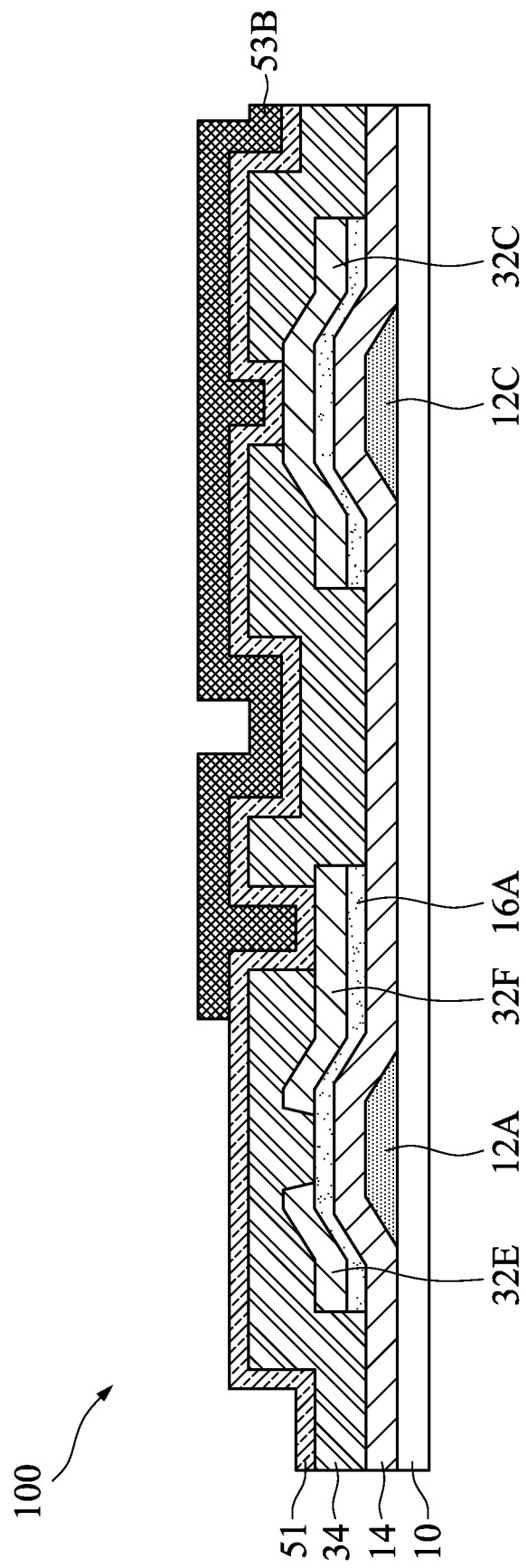
Figure 5G:
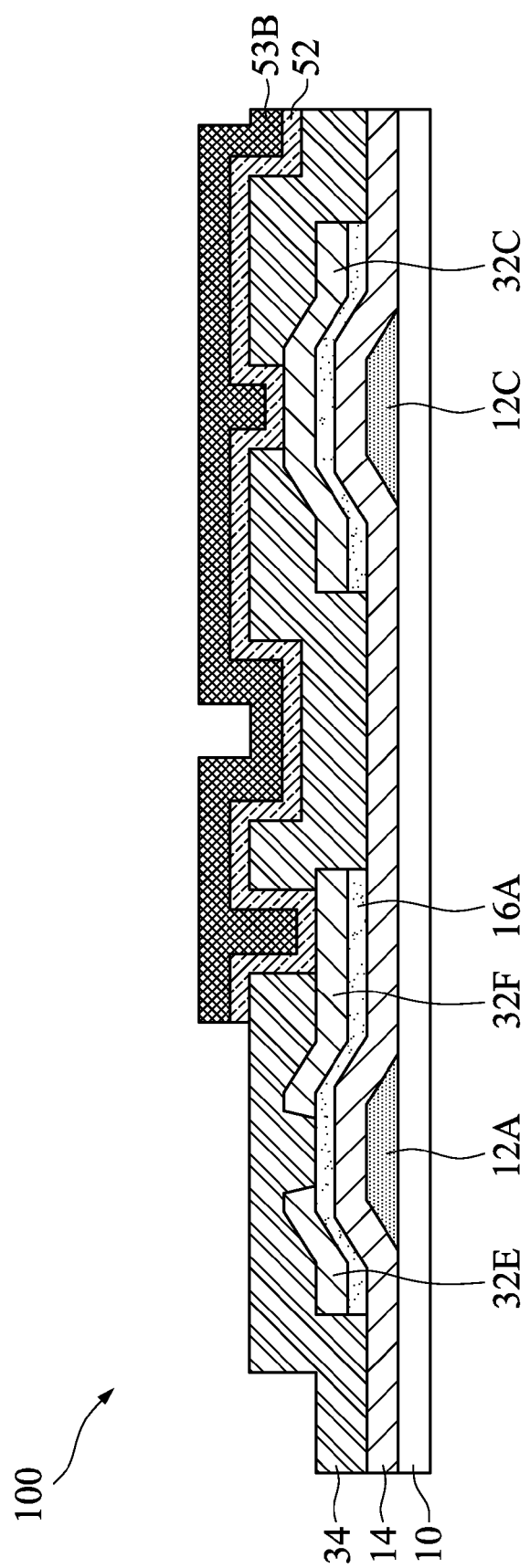

The pixel electrode 52 can be formed by two major ways. In the first way, a photoresist pattern 53A is formed on regions without the pixel electrode pattern 52 by a lithography process utilizing a photomask, as shown in FIG. 5C. The pixel electrode pattern 52 is then selectively deposited in the pixel region 300, as shown in FIG. 5D. At last, the photoresist pattern 53A is removed to form the structure as shown in FIG. 5A. In the second way, a pixel electrode layer is conformally formed in all regions, as shown in FIG. 5E. A photoresist pattern 53B is then formed on the pixel electrode layer 51 in the pixel region 300 by a lithography process with a photomask, as shown in FIG. 5F. The pixel electrode layer 51 not covered by the photoresist pattern 53B is then etched, as shown in FIG. 5G. At last, the photoresist pattern 53B is removed to form the structure as shown in FIG. 5A. Because the peripheral wiring region 150 does not need the pixel electrode layer 51, in the first way, the photoresist pattern 53A on the peripheral wiring region 150 should be further formed to prevent the pixel electrode pattern 52 from being formed thereon. Thereafter, the photoresist pattern 53A on the peripheral wring region 150 can be removed. On the other hand, in the second way, the photoresist pattern 53B on the peripheral wiring region will not be formed, such that the pixel electrode layer 51 on the peripheral wiring region 150 will be etched.

Accordingly, one embodiment provides a method to form the elements in the display region 100 and the peripheral wiring region 150 by two multi-tone photomasks and one general photomask. In another embodiment, the structure as shown in FIG. 1E can be formed by a lithography process with a general photomask, the structure as shown in FIG. 3I can be then formed by a lithography process with a multi-tone photomask, and the structure as shown in FIG. 5B can be then formed by a lithography process with a general photomask. In short, the display region 100 can be defined by one multi-tone photomask and two general photomasks without considering the peripheral wiring region 150. In a further embodiment, the structure as shown in FIG. 2F can be formed by a lithography process with a multi-tone photomask, and the structure as shown in FIG. 4F can be then formed by a lithography process with a general photomask. In short, the peripheral wiring region 150 can be defined by one multi-tone photomask and one general photomask without considering the display region 100. The array substrate containing the peripheral wiring region 150 can be applied in several optoelectronic devices such as a solar cell transferring a light energy to an electrical energy, or a display transferring an electrical energy to a light energy. In one embodiment, the display can be a large sized flat display (e.g. television), a medium sized display (e.g. e-book), or a small sized display (e.g. cell phone screen).

Compared to the related art, the multi-tone photomasks of the disclosure may save lithography processes and solve alignment problems. Because the disclosure is free of the lift-off process, there is no material formed on the photoresist layer. Therefore, the step of removing the photoresist layer may prevent the lift-off problems, e.g. material left on the array substrate which reduces production yield, or obstructing the stripper pipes. The selective deposition collocated with three photomasks used to form the insulation layer 14, the semiconductor layer 16, and the passivation layer 34 in the display region 100 and/or the peripheral wiring region 150 may increase the possibility of the mass production.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method of forming an array substrate, comprising:
    forming a first conductive layer on a substrate;
    forming a first photoresist layer on the first conductive layer;
    patterning the first photoresist layer by a lithography process with a first multi-tone photomask to form a first non-photoresist region, a first thin photoresist pattern, and a first thick photoresist pattern;
    etching the first conductive layer of the first non-photoresist region to form a gate electrode, a gate line connecting to the gate electrode, a common line, and a bottom conductive line, wherein the first thin photoresist pattern is on the gate electrode, the gate line, the common line, and a wiring region of the bottom conductive line, and wherein the first thick photoresist pattern is on a contact region of the bottom conductive line;
    ashing the first thin photoresist pattern to expose the gate electrode, the gate line, the common line, and the wiring region of the bottom conductive line;
    selectively depositing an insulation layer on the substrate, the gate electrode, the gate line, the common line, and the wiring region of the bottom conductive line;
    selectively depositing a semiconductor layer on the insulation layer;
    removing the first thick photoresist pattern; and
    forming a second conductive layer on the semiconductor layer and the contact region of the bottom conductive line.

2. The method as claimed in claim 1, further comprising:
forming a second photoresist layer on the second conductive layer;
patterning the second photoresist layer by a lithography process with a second multi-tone photomask to form a second non-photoresist region, a second thin photoresist pattern, a second sub-thick photoresist pattern, and a second thick photoresist pattern;
removing the second conductive layer and the semiconductor layer of the second non-photoresist region to form a data line, a conductive pattern connecting to the data line, a channel layer, a top conductive line, and a top electrode, wherein the data line and the gate line vertically cross with each other for defining a pixel region, wherein the top conductive line connects to the bottom conductive line, wherein the channel layer is disposed between the gate electrode and the conductive pattern, wherein the top electrode covers a part of the common line for defining a storage capacitor, and wherein the second thin photoresist pattern corresponds to a center part of the gate electrode, and the second sub-thick photoresist pattern corresponds to two sides of the conductive pattern, the data line, the top electrode, and the top conductive line;
ashing the second thin photoresist pattern to expose the conductive pattern on the center part of the gate electrode;
removing the exposed part of the conductive pattern to expose the channel layer on the center part of the gate electrode for forming a source electrode and a drain electrode, wherein the second thick photoresist pattern corresponds to a part of the drain electrode and a part of the top electrode;
ashing the second sub-thick photoresist pattern to expose the source electrode, the drain electrode, the data line, the top electrode, and the top conductive line;
selectively depositing a passivation layer on all regions other than the second thick photoresist pattern; and
ashing the second thick photoresist pattern to expose the part of the drain electrode and the part of the top electrode.

3. The method as claimed in claim 2, further comprising forming a pixel electrode pattern on the passivation layer of the pixel electrode, wherein the pixel electrode pattern connects to the exposed part of the drain electrode and the exposed part of the top electrode, and wherein the step of forming the pixel electrode pattern comprises:
forming a photoresist pattern covering all regions other than the pixel region;
selectively depositing the pixel electrode pattern on the pixel region; and
removing the photoresist pattern.

4. The method as claimed in claim 2, further comprising forming a pixel electrode pattern on the passivation layer of the pixel electrode, wherein the pixel electrode pattern connects to the exposed part of the drain electrode and the exposed part of the top electrode, and wherein the step of forming the pixel electrode pattern comprises:
forming a conductive layer on the pixel region and all regions other than the pixel region;
forming a photoresist pattern covering the conductive layer of the pixel region;
removing the conductive layer of the all regions other than the pixel region for defining the pixel electrode pattern; and
removing the photoresist pattern.

5. A method of forming an array substrate, comprising:
forming a gate electrode, a gate line connecting to the gate electrode, and a common line on a substrate;
depositing an insulation layer on the substrate, the gate electrode, the gate line, and the common line;
depositing a semiconductor layer on the insulation layer;
depositing a conductive layer on the semiconductor layer;
forming a photoresist layer on the conductive layer;
patterning the photoresist layer by a lithography process with a multi-tone photomask to form a non-photoresist region, a thin photoresist pattern, a sub-thick photoresist pattern, and a thick photoresist pattern;
removing the conductive layer and the semiconductor layer of the non-photoresist region to form a data line, a conductive pattern connecting to the data line, a channel layer, and a top electrode, wherein the data line and the gate line vertically cross with each other for defining a pixel region, wherein the channel layer is disposed between the gate electrode and the conductive pattern, wherein the top electrode covers a part of the common line for defining a storage capacitor, and wherein the thin photoresist pattern corresponds to a center part of the gate electrode, and the sub-thick photoresist pattern corresponds to two sides of the conductive pattern, the data line, and the top electrode;
ashing the thin photoresist pattern to expose the conductive pattern on the center part of the gate electrode;
removing the exposed part of the conductive pattern to expose the channel layer on the center part of the gate electrode for forming a source electrode and a drain electrode, wherein the thick photoresist pattern corresponds to a part of the drain electrode and a part of the top electrode;
ashing the sub-thick photoresist pattern to expose the source electrode, the drain electrode, the data line, and the top electrode;
selectively depositing a passivation layer on all regions other than the second thick photoresist pattern;
ashing the thick photoresist pattern to expose the part of the drain electrode and the part of the top electrode; and
forming a pixel electrode pattern on the passivation layer of the pixel electrode, wherein the pixel electrode pattern connects to the exposed part of the drain electrode and the exposed part of the top electrode.

6. The method as claimed in claim 5, wherein the step of forming the pixel electrode pattern comprises:
forming a photoresist pattern covering all regions other than the pixel region;
selectively depositing the pixel electrode pattern on the pixel region; and
removing the photoresist pattern.

7. The method as claimed in claim 5, wherein the step of forming the pixel electrode pattern comprises:
forming a further conductive layer on the pixel region and all regions other than the pixel region;
forming a photoresist pattern covering the further conductive layer of the pixel region;
removing the further conductive layer of the all regions other than the pixel region for defining the pixel electrode pattern; and
removing the photoresist pattern.

* * * * *